US010473736B2

(12) United States Patent
Notaroš et al.

(10) Patent No.: US 10,473,736 B2
(45) Date of Patent: Nov. 12, 2019

(54) SUBJECT-LOADED HELICAL-ANTENNA RADIO-FREQUENCY COIL FOR MAGNETIC RESONANCE IMAGING

(71) Applicants: Colorado State University Research Foundation, Fort Collins, CO (US); The General Hospital Corporation, Boston, MA (US)

(72) Inventors: Branislav M. Notaroš, Fort Collins, CO (US); Milan M. Ilic, Belgrade (RS); Alexey A. Tonyushkin, Quincy, MA (US); Nada J. Sekeljic, Hillsboro, OR (US); Pranav S. Athalye, Fort Collins, CO (US)

(73) Assignees: THE GENERAL HOSPITAL CORPORATION, Boston, MA (US); COLORADO STATE UNIVERSITY RESEARCH FOUNDATION, Fort Collins, CO (US)

( * ) Notice: Subject to any disclaimer, the term of this patent is extended or adjusted under 35 U.S.C. 154(b) by 788 days.

(21) Appl. No.: 14/932,539

(22) Filed: Nov. 4, 2015

(65) Prior Publication Data
US 2016/0124059 A1  May 5, 2016

Related U.S. Application Data

(60) Provisional application No. 62/074,777, filed on Nov. 4, 2014.

(51) Int. Cl.
*G01V 3/00*  (2006.01)
*G01R 33/34*  (2006.01)
(Continued)

(52) U.S. Cl.
CPC ........ *G01R 33/34046* (2013.01); *G01R 33/28* (2013.01); *G01R 33/34053* (2013.01); *G01R 33/583* (2013.01)

(58) Field of Classification Search
CPC .......... H01Q 11/08; H01Q 1/362; H01Q 1/36; H01Q 1/3275; H01Q 9/28; H01Q 9/27; G01R 33/34076; G01R 33/3676
(Continued)

(56) References Cited

U.S. PATENT DOCUMENTS 5,185,576 A * 2/1993 Vavrek ............. G01R 33/34046
324/318
5,289,129 A * 2/1994 Joseph ................. G01R 33/385
324/318

(Continued)

OTHER PUBLICATIONS

International Search Report and Written Opinion, PCT/US2015/059031, dated Feb. 4, 2016.
(Continued)

*Primary Examiner* — Rodney E Fuller
(74) *Attorney, Agent, or Firm* — Polsinelli PC; David R. Mika; Samuel Wade Johnson

(57) ABSTRACT

Example devices and methods of MRI scanning are disclosed herein. In an example, an MRI scanning system may include a structure defining a bore within which a subject is to be positioned for scanning. The system may also include a magnet to generate a primary magnetic field within the bore parallel to a longitudinal axis of the bore, and a helical-antenna radio-frequency (RF) coil oriented along the longitudinal axis to surround the subject. In addition, the system may include an RF signal generator to drive the helical-antenna RF coil to generate a circularly polarized (CP) RF magnetic field perpendicular to the longitudinal axis, as well as an RF detector to detect a response signal generated by tissues of the subject in response to the CP RF
(Continued)

magnetic field. Also included may be a computing system to create an image of the tissues of the subject based on the detected response signal.

24 Claims, 22 Drawing Sheets

(51) Int. Cl.
  *G01R 33/28* (2006.01)
  *G01R 33/58* (2006.01)
(58) Field of Classification Search
  USPC .......................................................... 324/309
  See application file for complete search history.

(56) References Cited

U.S. PATENT DOCUMENTS

| | | | |
|---|---|---|---|
| 5,357,958 A * | 10/1994 | Kaufman | G01R 33/34053 324/318 |
| 7,019,527 B2 | 3/2006 | Kleihorst et al. | |
| 8,066,759 B2 * | 11/2011 | Weber | A61F 2/88 600/422 |
| 8,744,551 B2 | 6/2014 | Koktzoglou et al. | |
| 2003/0020476 A1 * | 1/2003 | Duensing | G01R 33/34046 324/318 |
| 2003/0206017 A1 | 11/2003 | Boskamp | |
| 2003/0206143 A1 * | 11/2003 | Goldstein | H01Q 1/362 343/895 |
| 2005/0107681 A1 * | 5/2005 | Griffiths | A61B 5/0046 600/410 |
| 2006/0164322 A1 * | 7/2006 | Lan | H01Q 1/362 343/895 |
| 2008/0094308 A1 * | 4/2008 | Cowles | H01Q 1/08 343/895 |
| 2008/0174501 A1 | 7/2008 | Licul et al. | |
| 2008/0204021 A1 | 8/2008 | Leussler et al. | |
| 2011/0301450 A1 | 12/2011 | Hue et al. | |
| 2012/0169340 A1 | 7/2012 | Leussler et al. | |
| 2013/0035044 A1 * | 2/2013 | DiNallo | H01Q 1/36 455/77 |
| 2013/0049755 A1 | 2/2013 | Hollis et al. | |
| 2013/0147484 A1 * | 6/2013 | Shah | G01R 33/583 324/318 |
| 2013/0335081 A1 * | 12/2013 | Fordham | G01N 24/081 324/309 |
| 2014/0221814 A1 | 8/2014 | Ryu et al. | |
| 2015/0171517 A1 * | 6/2015 | Grandfield | H01Q 3/28 342/368 |
| 2016/0003753 A1 * | 1/2016 | Augustine | G01N 24/084 324/309 |
| 2016/0070001 A1 * | 3/2016 | Krantz | H01Q 1/362 342/357.72 |
| 2016/0084926 A1 * | 3/2016 | Kim | G01R 33/34046 324/322 |
| 2016/0204503 A1 * | 7/2016 | Faraone | H01Q 1/362 343/893 |
| 2018/0003782 A1 * | 1/2018 | Hassan | G01R 33/34007 |
| 2018/0070852 A1 * | 3/2018 | Azulay | A61B 5/0555 |

OTHER PUBLICATIONS

B. M. Notaros, M. M. Ilic, A. A. Tonyushkin, N. J. Sekeljic, and P. Athalye, "Quadrifilar Helical Antenna as a Whole-Body Traveling-Wave RF Coil for 3T and 7T MRI," *Proc. of International Society of Magnetic Resonance in Medicine*, May 30-Jun. 5, 2015, Toronto, Ontario, Canada. pp. 1825.

M. M. Ilic, A. A. Tonyushkin, N. Sekeljic, P. Athalye, and B. M. Notaros, "RF Excitation in 7 Tesla MRI Systems Using Monofilar Axial-Mode Helical Antenna," *Proc. of 2015 IEEE International Symposium on Antennas and Propagation & USNC/URSI National Radio Science Meeting*, Jul. 19-24, 2015, Vancouver, BC, Canada. pp. 1346-1347.

P. S. Athalye, N. J. Šekeljić, M. M. Ilić, A. A. Tonyushkin, A. J. M. Kiruluta, P. F. Van de Moortele, and B. M. Notaroš, "Long and Short Monofilar and Quadrifilar Helical Antenna RF Coils at 7 T," Invited Presentation, *10th Biennial 2015 Minnesota Workshop on High and Ultra-High Field Imaging*, Oct. 1-3, 2015, Minneapolis, MN.

P. S. Athalye, N. J. Šekeljić, M. M. Ilic, A. A. Tonyushkin, and B. M. Notaroš, "Using Subject-Loaded Quadrifilar Helical Antennas as RF Body Coils at 3 T," *10th Biennial 2015 Minnesota Workshop on High and Ultra-High Field Imaging*, Oct. 1-3, 2015, Minneapolis, MN.

M. M. Ilić, I. Perović, A. A. Tonyushkin, N. Šekeljić, P. Athalye, and B. M. Notaroš, "Full-Wave Frequency-Domain Electromagnetic Modelling of RF Fields in MRI Applications," *Proc. of 2015 IEEE International Symposium on Antennas and Propagation & USNC/URSI National Radio Science Meeting*, Jul. 19-24, 2015, Vancouver, BC, Canada. pp. 971-972.

M. Djordjević and B. M. Notaroš, "Double Higher Order Method of Moments for Surface Integral Equation Modeling of Metallic and Dielectric Antennas and Scatterers," *IEEE Transactions on Antennas and Propagation*, vol. 52, No. 8, pp. 2118-2129, Aug. 2004.

B. M. Notaroš, "Higher order frequency-domain computational electromagnetics. Invited review paper, Special Issue on Large and Multiscale Computational Electromagnetics," *IEEE Transactions on Antennas and Propagation*, vol. 56, No. 8, pp. 2251-2276, Aug. 2008.

A. R. Djordjević, A. G. Zajić, M. M. Ilić, and G. L. Struber, "Optimization of Helical Antennas [Antenna Designer's Notebook]," *IEEE Antennas and Propagation Magazine*, vol. 48, No. 6, pp. 107-115, Dec. 2006.

M. Alecci, C. M. Collins, M. B. Smith, and P. Jezzard, "Radio Frequency Magnetic Field Mapping of a 3 Tesla Birdcage Coil: Experimental and Theoretical Dependence on Sample Properties," *Magnetic Resonance in Medicine*, vol. 46, pp. 379-385, 2001.

M. Alecci, C. M. Collins, J. Wilson, W. Liu, M. B. Smith, and P. Jezzard, "Theoretical and Experimental Evaluation of Detached Endcaps for 3 T Birdcage Coils," *Magnetic Resonance in Medicine*, vol. 49, pp. 363-370, 2003.

D. C. Alsop, T. J. Connick, and G. Mizsei, "A Spiral Volume Coil for Improved RF Field Homogeneity at High Static Magnetic Field Strength," *Magnetic Resonance in Medicine*, vol. 40, pp. 49-54, 2005.

A. Andreychenko, J. J. Bluemink, A. J. E Raaijmakers, J. J. W. Lagendijk, P. R. Luijten, and C. A. T. van den Berg, "Improved RF Performance of Travelling Wave MR with a High Permittivity Dielectric Lining of the Bore," *Magnetic Resonance in Medicine*, vol. 70, pp. 885-894, 2012.

A. Andreychenko, H. Kroeze, V. O. Boer, J. J. W. Lagendijk, P. R. Luijten, and C. A. T. van den Berg, "Improved Steering of the RF Field of Traveling Wave MR with a Multimode, Coaxial Waveguide," *Magnetic Resonance in Medicine*, vol. 71, pp. 1641-1649, 2013.

A. Andreychenko, H. Kroeze, D. W. J. Klomp, J. J. W. Lagendijk, P. R. Luijten, and C. A. T. van den Berg, "Coaxial Waveguide for Travelling Wave MRI at Ultrahigh Fields," *Magnetic Resonance in Medicine*, vol. 70, pp. 875-884, 2012.

D. O. Brunner, N. De Zanche, J. Frohlich, J. Paska, and K. P. Pruessmann, "Traveling-Wave Magnetic Resonance," *Nature*, 457(7232), pp. 994-998, 2011.

D. O. Brunner, J. Paska, J. Frohlich, and K. P. Pruessmann, "Traveling-Wave RF Shimming and Parallel MRI," *Magnetic Resonance in Medicine*, vol. 66, pp. 290-300, 2011.

X. Chen, V. Taracila, T. Eagan, H. Fujita, X. Shou, T. Baig, and R. Brown, "An Antenna-Theory Method for Modeling High-Frequency RF Coils: A Segmented Birdcage Example," *International Journal of Antennas and Propagation*, 2008.

J. Hoffmann, G. Shajan, J. Budde, K. Scheffler, and R. Pohmann, "Human brain imaging at 9.4 T using a tunable patch antenna for transmission," *Magnetic Resonance in Medicine*, vol. 69, pp. 1494-1500, 2013.

B. Hu, S. Farhat, and P. Glover, "A Horn Antenna Improves the Transmit Field Homogeneity in the Human Brain using the Travelling Wave Technique," *Proc. of International Society of Magnetic Resonance in Medicine*, 2010. pp. 1481.

(56) References Cited

OTHER PUBLICATIONS

D. J. Lee and P. M. Glover, "A Comparison of a Patch Antenna to an End-fire Helix Antenna for use in Travelling Wave MRI," *Proc. of International Society of Magnetic Resonance in Medicine*, 2010. pp. 431.
Y. Li, A. G. Webb, S. Saha, W. W. Brey, C. Zachariah, and A. S. Edison, "Comparison of the performance of round and rectangular wire in small solenoids for high-field NMR," *Magnetic Resonance in Chemistry*, vol. 44, pp. 255-262, 2006.
T. Liebig, J. T. Svejda, H. Yang, A. Rennings, J. Froehlich, and D. Erni, "Accurate and fast longitudinal RF magnetic field profiling for 7T traveling-wave MRI systems," *Proc. of International Society of Magnetic Resonance in Medicine*, 2014. pp. 1358.
J. Mallow, T. Herrmann, K.-N. Kim, J. Stadler, J. Mylius, M. Borsch, and J. Bernarding, "Ultra-high field MRI for primate imaging using the travelling-wave concept," *Magnetic Resonance Materials in Physics, Biology and Medicine*, vol. 26, pp. 389-400, 2013.
M. F. Mueller, M. Blaimer, F. Breuer, T. Lanz, A. Webb, M. Griswold, and P. Jakob, "Double Spiral Array Coil Design for Enhanced 3D Parallel MRI at 1.5 Tesla," *Concepts in Magnetic Resonance Part B (Magnetic Resonance Engineering)*, vol. 35B(2), pp. 67-79, 2009.
M. A. Ohliger and D. K. Sodickson, "An introduction to coil array design for parallel MRI," *NMR in Biomedicine*, vol. 19, pp. 300-315, 2006.
A. J. E. Raaijmakers, A. Van der Werf, H. Kroeze, P. R. Luijten, C. A. T. Van den Berg, and D. W. J. Klomp, "Helix antennas: approaching the target from a different angle," *Proc. of the Joint Annual Meeting ISMRM-ESMRMB 2014*, Milan, Italy, 2014.
G. Shajan, J. Hoffmann, D. Z. Balla, D. K. Deelchand, K. Scheffler, and R. Pohmann, "Rat brain MRI at 16.4T using a capacitively tunable patch antenna in combination with a receive array," *NMR in Biomedicine*, vol. 25, pp. 1170-1176, 2012.
J. Tian, L. DelaBarre, J. Strupp, J. Zhang, J. Pfeuffer, M. Hamm, J. Nistler, K. Ugurbil, and J. T. Vaughan, "Searching for the Optimal Body Coil Design for 3T MRI," *Proc. of International Society of Magnetic Resonance in Medicine*, 2013. pp. 2746.
A. A. Tonyushkin, N. B. Konyer, M. D. Noseworthy, and A. J. M. Kiruluta, "Imaging with dielectric waveguide approach for 3T MRI," *Proc. of International Society of Magnetic Resonance in Medicine*, 2012.
A. A. Tonyushkin, N. B. Konyer, M. D. Noseworthy, and A. J. M. Kiruluta, "Quasi-static traveling wave imaging on a clinical 3T MRI system," *Proc. of International Society of Magnetic Resonance in Medicine*, 2013. pp. 2798.
K. Ugurbil, "Magnetic resonance imaging at ultrahigh fields," *IEEE Trans Biomed Eng*, vol. 61, pp. 1364-1379, May 2014.
K. Ugurbil, G. Adriany, P. Andersen, W. Chen, M. Garwood, R. Gruetter, P. G. Henry, S. G. Kim, H. Lieu, I. Tkac, T. Vaughan, P. F. Van De Moortele, E. Yacoub, and X. H. Zhou, "Ultrahigh field magnetic resonance imaging and spectroscopy," *Magn Reson Imaging*, vol. 21, pp. 1263-1281, Dec. 2003.
R. Umathum and M. Bock, "Multi-Pass Travelling Wave vol. Coil," *Proc. of International Society of Magnetic Resonance in Medicine*, 2011. pp. 1905.
A. T. Van den Berg, B. Van den Bergen, J. B. Van de Kamer, B. W. Raaymakers, H. Kroeze, L. W. Bartels, and J. J. W. Lagendijk, "Simultaneous $B_1^+$ Homogenization and Specific Absorption Rate Hotspot Suppression Using a Magnetic Resonance Phased Array Transmit Coil," *Magnetic Resonance in Medicine*, vol. 57, pp. 577-586, 2007.
J. T. Vaughan, G. Adriany, C. J. Snyder, J. Tian, T. Thiel, L. Bolinger, H. Liu, L. J. DelaBarre, and K. Ugurbil, "Efficient High-Frequency Body Coil for High-Field MRI," *Magnetic Resonance in Medicine*, vol. 52, pp. 851-859, 2004.
J. T. Vaughan, C. J. Snyder, L. J. DelaBarre, P. J. Bolan, J. Tian, L. Bolinger, G. Adriany, P. Anderson, J. Strupp, and K. Ugurbil, "7 T Whole Body Imaging: Preliminary Results," *Magnwtic Resonance in Medicine*, vol. 61(1), pp. 244-248, 2009.
F. Vazquez, R. Martin, O. Marrufo, and A. O. Rodriguez, "Travelling wave magnetic resonance imaging at 3 T," *Journal of Applied Physics*, vol. 114, 2013.
G. C. Wiggins, B. Zhang, M. Cloos, R. Lattanzi, G. Chen, L. Karthik, G. Haemer, and D. Sodickson, "Mixing loops and electric dipole antennas for increased sensitivity at 7 Tesla," *Proc. of International Society of Magnetic Resonance in Medicine*, 2013. pp. 2737.
Q. X. Yang, W. Mao, J. Wang, M. B. Smith, H. Lei, X. Zhang, K. Ugurbil, and W. Chen, "Manipulation of image intensity distribution at 7.0 T: Passive RF shimming and focusing with dielectric materials," *Journal of Magnetic Resonance Imaging*, vol. 24, pp. 197-202, 2006.
Q. X. Yang, S. Rupprecht, W. Luo, C. Sica, Z. Herse, J. Wang, Z. Cao, J. Vesek, M. Lanagan, G. Carluccio, Y.-C. Ryu, and C. M. Collins, "Radiofrequency Field Enhancement With High Dielectric Constant (HDC) Pads in a Receive Array Coil at 3.0T," *Journal of Magnetic Resonance Imaging*, vol. 38, 435-440, 2013.
H. Yoo, G. Anand, and J. T. Vaughan, "A Method to Localize RF $B_1$ Field in High-Field Magnetic Resonance Imaging Systems," *IEEE Transactions on Biomedical Engineering*, vol. 59, No. 12, pp. 3365-3371, Dec. 2012.
B. Zhang, D. K. Sodickson, R. Lattanzi, Q. Duan, B. Stoeckel, G. C. Wiggins, "Whole body traveling wave magnetic resonance imaging at high field strength: Homogeneity, efficiency, and energy deposition as compared with traditional excitation mechanisms," *Magnetic Resonance in Medicine*, vol. 67, 4. pp. 1183-1193, Apr. 2012.
B. Zhang, G. Wiggins, Q. Duan, and D. K. Sodickson, "Design of a Patch Antenna for Creating Traveling Waves at 7 Tesla," *Proc. of International Society of Magnetic Resonance in Medicine*, 2009. pp. 4746.

\* cited by examiner

| MAGNETIC FIELD $B_0$ | LARMOR FREQ. $f_0$ |
|---|---|
| 3 T | 127.8 MHz |
| 4 T | 170 MHz |
| 7 T | 300 MHz |
| 9.4 T | 400 MHz |
| 10.5 T | 450 MHz |
| 11 T | 468 MHz |
| 16.4 T | 685 MHz |
| 21.1 T | 900 MHz |

FIG. 3

SUBJECT-LOADED HELICAL-ANTENNA RADIO-FREQUENCY COIL FOR MAGNETIC RESONANCE IMAGING

CROSS-REFERENCE TO RELATED APPLICATIONS

This application claims the benefit of priority to U.S. Provisional Application No. 62/074,777, filed Nov. 4, 2014, and titled "Method and Apparatus for Generation of Traveling Waves in High-Field and Ultra-High-Field MRI Systems Using Bore-Extended, Subject-Loaded Helical Antennas," which is hereby incorporated herein by reference in its entirety.

STATEMENT REGARDING FEDERALLY SPONSORED RESEARCH

This invention was made with government support under Grant No. ECCS1307863 awarded by the National Science Foundation. The government has certain rights in the invention.

FIELD OF THE INVENTION

The present invention relates to medical apparatus and methods. More specifically, the present invention relates to high-field and ultra-high-field magnetic resonance imaging (MRI) systems employing a helical-antenna radio-frequency (RF) coil.

BACKGROUND OF THE INVENTION

MRI scanners have long facilitated non-invasive, high-resolution imaging of internal structures of the human body based on the principle of nuclear magnetic resonance (NMR). Generally speaking, under that principle, atomic nuclei of tissue to be imaged absorb and reemit applied radio-frequency (RF) radiation based on the resonant radian frequency (labeled the Larmor frequency, $f_0$) with which the quantum spin of the nuclei precesses in an external polarizing, static magnetic field (referred to as $B_0$). $B_0$ is typically generated via a main coil, often referred to as the "magnet," and is further altered by way of one or more gradient coils that vary the magnitude of the static magnetic field $B_0$, and thus the resonant frequency $f_0$, in space and time to allow for selective excitation of tissue. Generally, the static magnetic field $B_0$ is aligned along the longitudinal axis of the bore of the MRI scanner into which subjects to be scanned, such as human patients, are placed.

To facilitate the actual scanning, an RF excitation coil may be used to apply an RF excitation magnetic field $B_1$ orthogonally to the static magnetic field $B_0$ periodically, resulting in a realignment of the spins of the atomic nuclei. After each excitation, a relaxation of the realignment results in an echo RF signal being emitted by the nuclei, which is then captured by the scanner to generate the image of the tissue. Depending on the particular MRI scanner, the echo RF signal may be received by the excitation coil, or by a separate RF detector coil or other receiver structure.

In many high-field (e.g., $B_0$=3 Tesla (T)) MRI scanners, a "birdcage" RF coil, typically formed by two circular metallic loops ("end rings") at opposing ends of, and transverse to, the MRI scanner bore, and interconnected by an even number of longitudinal straight metallic segments ("legs"), is used to generate the excitation field $B_1$. Typically, lumped capacitors are located along the rings between each pair of legs to tune the structure to render a near-homogeneous distribution for the excitation field $B_1$. This structure is often driven by two excitation ports located along one ring in time-phase quadrature (90 degrees out of phase with respect to each other), resulting in the generation of a circularly polarized (CP), and more specifically a right-hand circularly polarized (RCP), excitation field $B_1^+$ in the near-field of the coil that helps maximize coupling between the excitation field and the tissue nuclei spins, resulting in a higher-resolution scan.

Generally, the higher the static magnetic field $B_0$ that is employed, the more sensitive the MRI scanner is in detecting tissue differences, especially tissues located deep within a patient. However, since the Larmor frequency $f_0$ is proportional to the magnitude of the static magnetic field $B_0$, the use of ultra-high-field (e.g., $B_0$=7 T) MRI scanners results in a significant shortening of the RF wavelengths employed. Consequently, the use of quasi-static, near-field RF coils, such as the one described above, tend to become limited to smaller, body-part MRI scanners, as opposed to whole-body MRI scanners, as the magnitude of the static field $B_0$ increases due to the resulting reduction in size of the near field.

To compensate for the near-field reduction, MRI scanner technology has been developed that employs RF excitation using far-field antennas generating traveling waves (TW) within the MRI scanner bore. Examples of such RF excitation far-field antennas include, for example, axially-placed double-loop coils, dipole arrays, and axially-placed helical antennas located some distance from the patient. Such technology, however, has typically resulted in a number of issues, such as a high specific absorption rate (SAR) in tissues located near the antenna, resulting in unwanted heating of those tissues, as well as rapid attenuation of the excitation field and the resulting echo response as distance from the antenna increases.

With the above concepts in mind, as well as others not explicitly discussed herein, various embodiments of systems and methods employing a subject-loaded helical-antenna RF coil are disclosed herein.

SUMMARY

In one embodiment, a magnetic resonance imaging (MRI) scanning system may include a structure defining a bore within which a subject is to be positioned for scanning, in which the bore defines a longitudinal axis. The system may also include a magnet to generate a primary magnetic field within the bore parallel to the longitudinal axis, as well as a helical-antenna RF coil oriented along the longitudinal axis to at least partially surround the subject when the subject is positioned within the bore for scanning. The system may further include an RF signal generator to drive the helical-antenna RF coil to generate a CP RF magnetic field perpendicular to the longitudinal axis, and an RF detector to detect a response signal generated by tissues of the subject in response to the CP RF magnetic field. A computing system may be used to create an image of the tissues of the subject based on the detected response signal.

In another embodiment, a method of MRI scanning may include driving a magnet coil to create a primary magnetic field within a bore of an MRI scanning system along a longitudinal axis of the bore, and driving a helical-antenna RF coil oriented along the bore with an RF signal to generate a CP RF magnetic field perpendicular to the longitudinal axis. Also in the method, a response signal generated by tissues of a subject at least partially positioned in a volume defined by the helical-antenna RF coil may be detected in response to the CP RF magnetic field. An image of the tissues of the subject may be created based on the detected response signal.

While multiple embodiments are disclosed, still other embodiments of the present invention will become apparent to those skilled in the art from the following detailed description, which depicts and describes illustrative embodiments of the invention. As will be realized, the invention is capable of modifications in various aspects, all without departing from the scope of the present invention. Accordingly, the drawings and detailed description are to be regarded as illustrative in nature and not restrictive.

BRIEF DESCRIPTION OF THE DRAWINGS

FIG. 3 is a table relating example MRI static magnetic fields to their corresponding approximate resonant frequencies of a hydrogen nucleus.

FIG. 12A is a side view of the example quadrifilar helical-antenna RF coil of FIG. 12 employing impedance matching plates.

DETAILED DESCRIPTION

The following detailed description relates to example MRI scanning systems that employ a subject-loaded helical antenna as an RF excitation coil. Use of such a system, in which the subject (e.g., a patient to be scanned) is at least partially surrounded by the helical-antenna RF coil, may cause the tissues of the patient to be exposed to a transverse magnetic field caused by an RF excitation signal generated using the helical-antenna RF coil.

As a result of at least some of the embodiments discussed in greater detail below, the generated transverse magnetic field, which is circularly polarized, may be highly uniform along the longitudinal axis defined by the helical-antenna RF coil to facilitate accurate imaging and high signal-to-noise ratio (SNR) while maintaining the amount of energy absorbed by the subject within acceptable limits. Other aspects and potential advantages of the embodiments disclosed herein are also presented below.

In general, helical antennas are employed in technology areas such as communications in axial mode to produce a traveling-wave (TW) circularly-polarized (CP) field along its longitudinal axis to provide efficient signal transmission over long distances (e.g., in free space, far from the antenna). However, according to various examples discussed hereafter, a helical antenna may also be employed to provide satisfactory CP RF excitation signal penetration into the tissues of a patient in an ultra-high field (e.g., $B_0$=7 T) MRI scanner when the patient is located within the volume defined by the helical antenna (e.g., in the near-field of the antenna).

Figure 1:
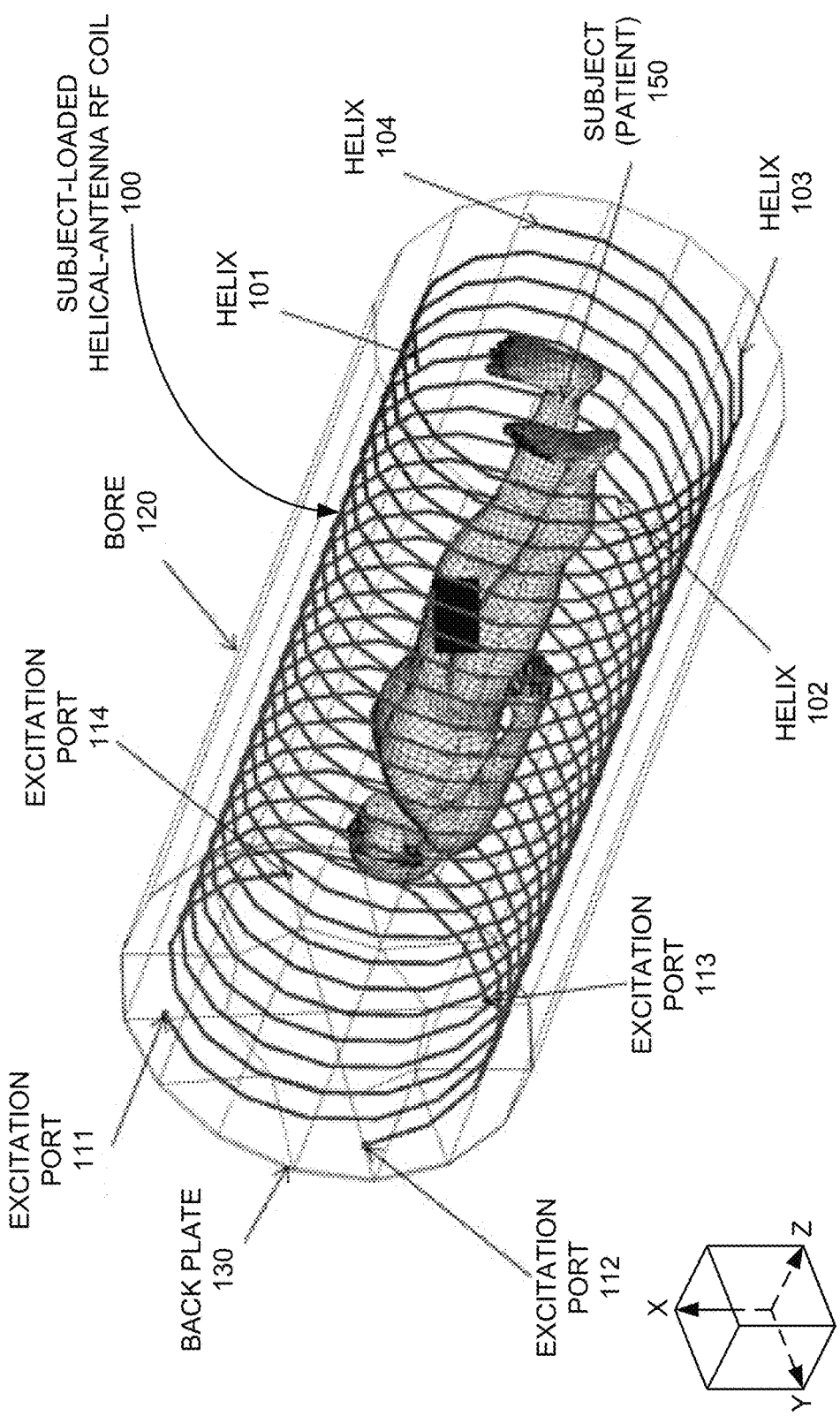
FIG. 1 is a perspective view of an example quadrifilar (four-channel) subject-loaded helical-antenna RF coil for use in an MRI scanning system.

FIG. 1 is a perspective view of an example subject-loaded helical-antenna RF coil 100 for use in a bore 120 of an MRI scanning system. In this example, the helical-antenna RF coil 100 is a quadrifilar (four-channel) helical-antenna RF coil that includes four interleaved helices 101, 102, 103, and 104 oriented in a clockwise (right-hand) rotation when viewed from the left end of the helices 101-104 as shown in FIG. 1. In other examples, the helical-antenna RF coil 100 may include different numbers of helices in a variety of configurations, some of which are described in greater detail below. As shown, a longitudinal axis of the helical-antenna RF coil 100 is oriented parallel to, and may be substantially aligned with, a central longitudinal axis of a bore 120 of the MRI scanner.

In the particular example of FIG. 1, each helix 101-104 may be coupled to a conductive back plate 130 by way of an excitation port 111, 112, 113, and 114, respectively. Moreover, each excitation port 111-114 is located along back plate 130 one-quarter revolution, or 90 degrees, from both its preceding port and following port 111-114. In one example, each of the excitation ports 111-114 may be a BNC (Bayonet Neill-Concelman) connector that is fed an RF signal via a coaxial cable, although other types of transmission and connection components may be used in other embodiments. An RF excitation signal may be applied to each excitation port 111-114 such that the helical-antenna RF coil 100 generates a CP magnetic field within the volume defined by the helical-antenna RF coil 100 that is useful for ultra-high field MRI scanning of a subject (e.g., patient) 150. Other configurations by which each of the helices 101-104 is driven by an RF signal may be utilized in other examples. In one example, each helix 101-104 may be driven by an independent RF channel, thus facilitating parallel imaging, spatial encoding, imaging acceleration, and the like.

Figure 2:
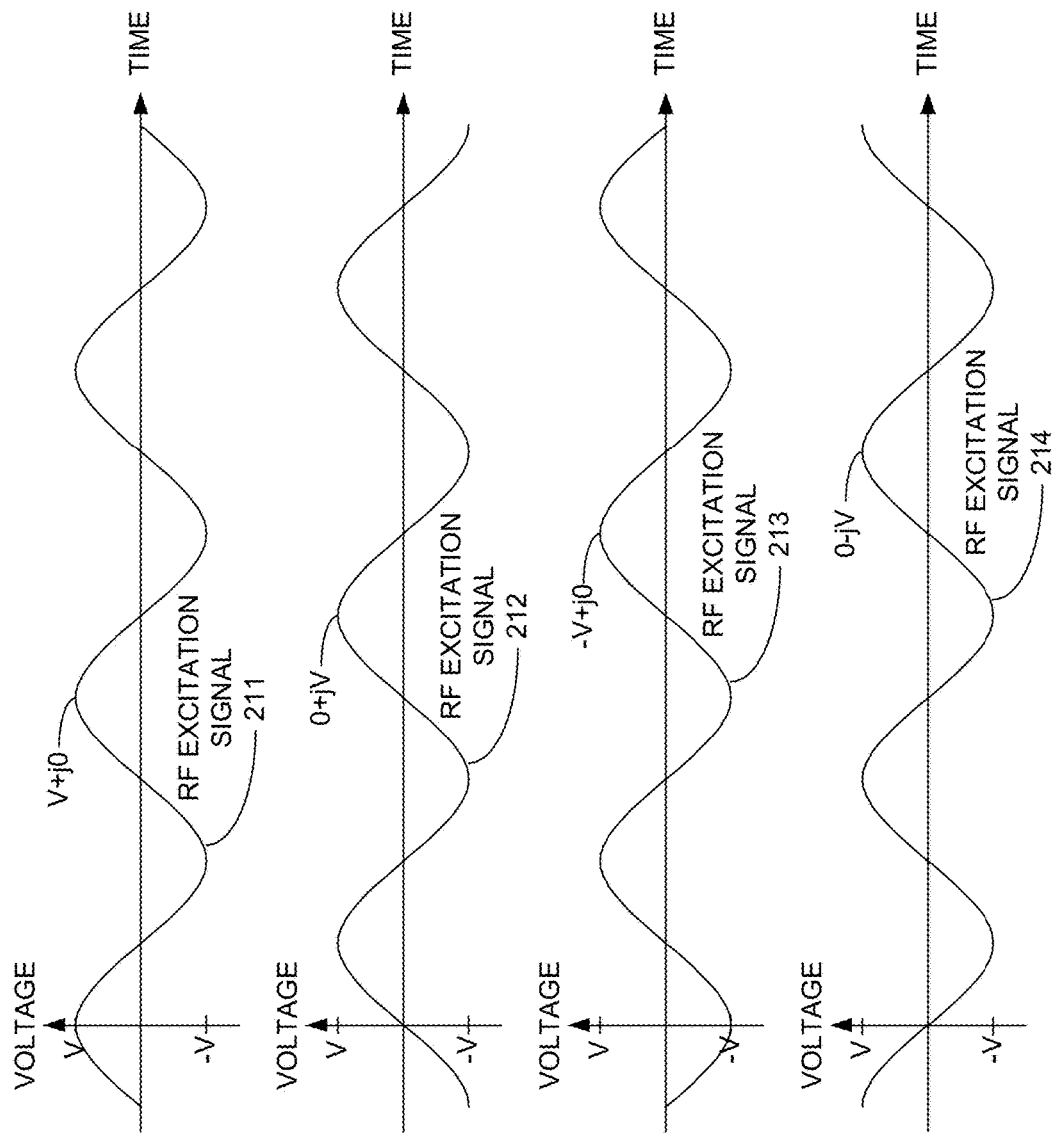
FIG. 2 is a timing diagram of example RF excitation signals, excluding encompassing impulses, for the quadrifilar helical-antenna RF coil of FIG. 1.

FIG. 2 is a timing diagram of example RF excitation signals 211-214 for the quadrifilar helical-antenna RF coil 100 of FIG. 1. Each of the RF excitation signals 211-214 is provided to a corresponding excitation port 111-114, respectively, as mentioned above. In this embodiment, the RF excitation signals 211-214 are sinusoidal voltages presented in quadrature, in which each of the RF excitation signals is 90 degrees out of phase from adjacent signals. For example, using complex rectangular coordinate notation, the first excitation signal 211 is V+j0, the second excitation signal 212 is 0+jV, the third excitation signal 213 is −V+j0, and the fourth excitation signal 214 is 0−jV, in which V is the magnitude of each excitation signal 211-214, and j is the imaginary unit (i.e., $\sqrt{-1}$). However, time-varying voltages other than sinusoidal voltages may be employed for the RF excitation signals 211-214 in other embodiments. Generally, the RF excitation signals 211-214 are pulsed, in which a number of cycles of the RF excitation signals 211-214 drive the helices 101-104, and then terminated briefly so that the RF response signal from the tissues of the subject 150 may be detected. Accordingly, given the arrangement of the excitation ports 111-114 in conjunction with the quadrature excitation signals 211-214, the helical-antenna RF coil 100 produces a CP (e.g., a right-hand circularly-polarized (RCP)) excitation magnetic field $B_1$. In other examples, quadrifilar helices with one-turn circumferences shorter than a wavelength (e.g., in bores at $B_0 < 7$ T) may operate in "normal mode," but may still produce a CP $B_1$ field within the volume defined by the helices 101-104 (e.g., in the near field) due to quadrature excitation.

Other multifilar, multi-channel helices may be operated at ultra-high $B_0$ fields in a similar manner. In one embodiment, a helical-antenna RF coil may have N coaxially-wound interleaved helices, with each helix being driven by a corresponding voltage having a relative phase offset of 360/N degrees from the voltages of adjacent helices. Thus, for example, a helical-antenna RF coil having six helices may be associated with driving voltages having corresponding phase offsets of 0, 60, 120, 180, 240, and 300 degrees.

In an example, the frequency of the excitation signals 211-214 is the Larmor frequency $f_0$ related to the strength of the primary magnetic field $B_0$ so that the tissues of the subject 150 will emit a detectable RF signal in response. FIG. 3 is a table relating example MRI static magnetic fields $B_0$ to their corresponding approximate resonance (Larmor) frequencies $f_0$ for a single proton (e.g., a hydrogen nucleus). As is shown in the table, higher primary magnetic fields $B_0$ are associated with linearly higher Larmor frequencies $f_0$, rendering use of most near-field, and many far-field, excitation techniques problematic due to the associated shortening of the wavelengths involved, as mentioned above. Nuclei of other elements aside from hydrogen may also be considered for imaging in other embodiments.

In various simulations and tests involving the example helical excitation antennas disclosed herein, such as the helical-antenna RF coil 100 of FIG. 1 and others presented below, a number of potential benefits have been noted. For example, nearly ideal circular polarization for the right-hand transverse components (e.g., normal to the longitudinal axis z of the antenna 100 and bore 120, as well as normal to the primary field $B_0$) of the excitation field $B_1$ (termed $B_1^+$) may be achieved along the longitudinal axis of the antenna 100 and bore 120, and significant circular polarization may be maintained in other areas within the subject 150. In some examples, a low (e.g., close to unity) value for the axial ratio (AR), which is the ratio of the major and minor axes of the polarization ellipse of the transverse field $B_1$, indicates a dominant RCP component $B_1^+$ over a left-hand CP (LCP) component, $B_1^-$, resulting in a high signal-to-noise ratio (SNR) with the use of a excitation field $B_1$ of modest power.

Also, the helical-antenna RF coil 100 may provide high spatial uniformity of the transverse excitation field $B_1$ field along the longitudinal (z) axis of the bore 120, as well as elsewhere within the subject 150, resulting in a corresponding increase in MRI image quality. Further, a strong coupling of the transverse magnetic field $B_1$ with the subject 150, as well as strong field penetration throughout the entire subject 150, may be attainable to facilitate better MRI image quality. In addition, use of the helical-antenna RF coil 100 and various embodiments may result in a low local specific absorption rate (SAR) at each point in the subject 150 within the near field of the helical-antenna RF coil 100, likely resulting in enhanced safety for the subject 150.

Figure 4:
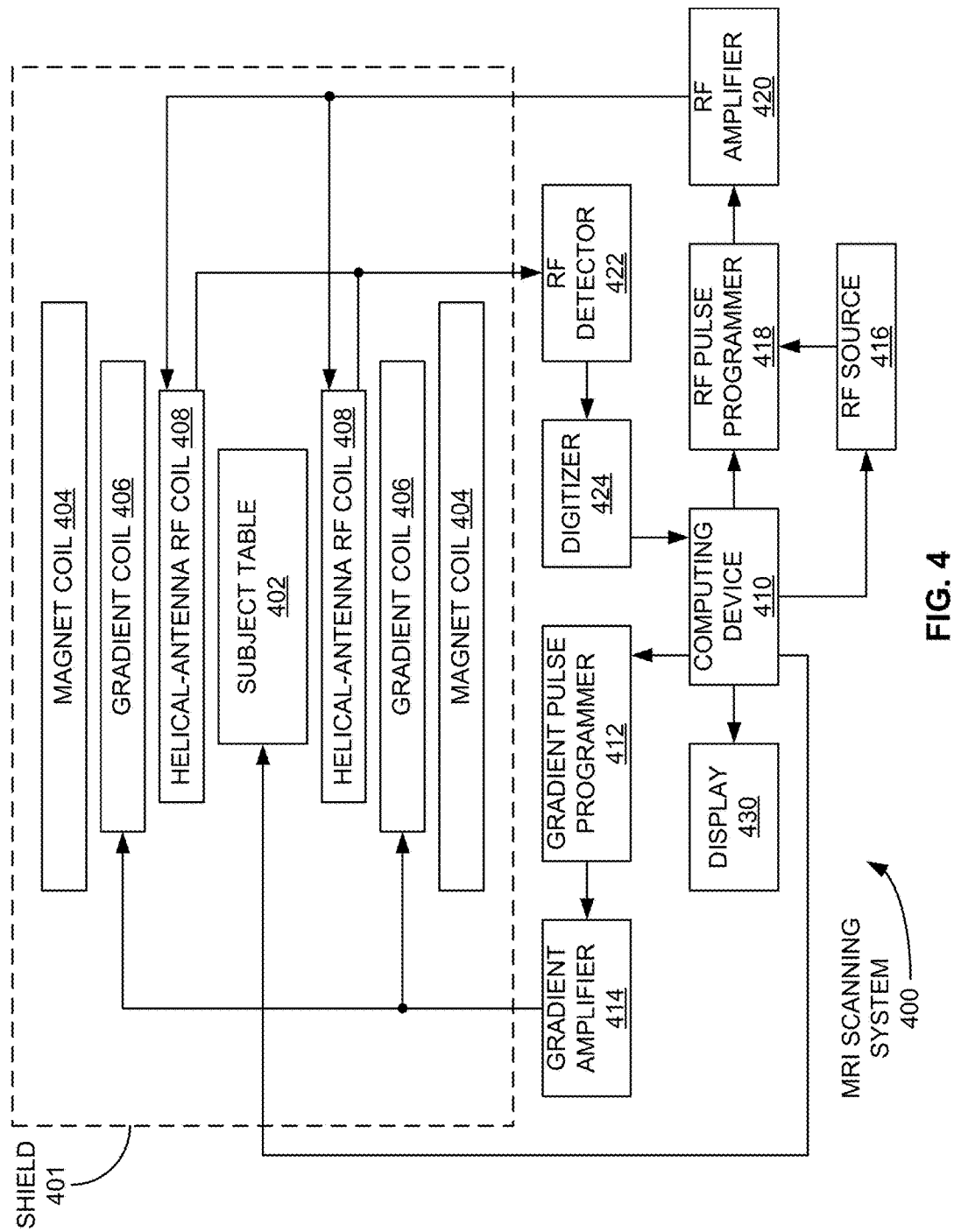
FIG. 4 is a block diagram of an example MRI scanning system employing a subject-loaded helical-antenna RF coil.

FIG. 4 is a block diagram of an example MRI scanning system 400 employing a helical-antenna RF coil, such as the helical-antenna RF coil 100 of FIG. 1. In one example, the MRI scanning system 400 includes a magnet coil 404, one or more gradient coils 406, and a helical-antenna RF coil 408 (e.g., the helical-antenna RF coil 100 of FIG. 1) (shown in pseudo-cross section in FIG. 4 to orient the reader) located within a magnetic shield 401 to prevent the field generated by the magnet coil 404 from interfering with equipment external to the MRI scanning system 400. In addition, the room within which the MRI scanning system 400 may employ RF shielding to prevent distortion of the MRI images being generated. Also included within the bore (not explicitly illustrated in FIG. 4) of the MRI scanning system 400 may be a motorized subject table 402 upon which a patient or other subject 150 may be placed to locate the subject 150 within the bore 120 under the control of a computing device 410.

The magnet coil 404 may provide the primary magnetic field $B_0$ within the bore 120 and aligned parallel to the longitudinal axis of the bore 120 (e.g., in the z-direction). The one or more gradient coils 406 may be oriented to apply a gradient to the primary magnetic field $B_0$ in the z-direction so that only a single virtual axial "slice" of the subject 150 being scanned is responsive to the transverse excitation field $B_1$ associated with a particular resonant frequency. In some examples, one or more shim coils may also be employed in the MRI scanning system 400 to alleviate inhomogeneities in the primary magnetic field $B_0$ generated by the magnet coil 404.

Also, one or more of the gradient coils 406 may be employed to create gradients in the x-direction and y-direction (e.g., transverse to the z-direction) of the primary magnetic field $B_0$ so that a small portion of the selected axial slice of the subject 150 may generate a relaxation response to the transverse excitation field $B_1$ generated by a particular RF excitation signal frequency. The computing device 410 may program or control a gradient pulse programmer 412 to generate pulsed signals that are subsequently amplified by a gradient amplifier 414 and used to drive the gradient coils 406 to alter the primary magnetic field $B_0$ as described above. In addition, an insert gradient coil (not illustrated in FIG. 4), sometimes installed within the bore 120 to enhance the performance of the MRI scanning system 400, may be employed in conjunction with the helical-antenna RF coil 408.

The helical-antenna RF coil 408, such as the helical-antenna RF coil 100 of FIG. 1 and other examples discussed below, generates the RF signal and associated transverse magnetic field $B_1$ employed to excite the subject 150 tissue for imaging purposes. To that end, the computing system 410 may control an RF source 416 that may generate one or more RF excitation voltages, as well as an RF pulse programmer 418 that produces pulses of the RF excitation voltages received from the RF source 416. The resulting RF pulse signals may then be amplified by way of an RF amplifier 420 and forwarded to the helical-antenna RF coil 408. Using the helical-antenna RF coil 100 of FIG. 1 as an example, the amplified RF pulse signals may be the pulsed RF excitation signals 211-214 described above in relation to FIG. 2 that are presented by way of the excitation ports 111-114 of the respective helices 101-104 of the helical-antenna RF coil 100.

The MRI scanning system 400 also includes an RF detector 422 configured to detect RF response signals generated by tissues of the subject 150 in response to the transverse magnetic field $B_1$, as discussed earlier. As shown in FIG. 4, the RF detector receives the response signals from the helical-antenna RF coil 408; however, in other examples, a separate detection coil may be used for such a purpose. A digitizer 424 may digitize the RF signals detected at the RF detector 422 and provide the digitized signals to the computing device 410. In turn, the computing device 410 may employ the magnitude and other characteristics of the digitized signals to generate images of the tissues of the subject 150, which may be presented by way of a display 430, as well as be stored in a data storage device or system (not explicitly depicted in FIG. 4).

In various embodiments of the MRI scanning system 400, the computing device 410 may include one or more processors that execute instructions that cause the computing device 410 to perform its various functions, as described above. An example of the computing device 410 is discussed below in conjunction with FIG. 21.

The MRI scanning system 400 represents just one particular example of an MRI/NMR system in which a helical-antenna RF coil may be employed, as many other types of scanning systems may use such a coil in various embodiments.

Figure 5:
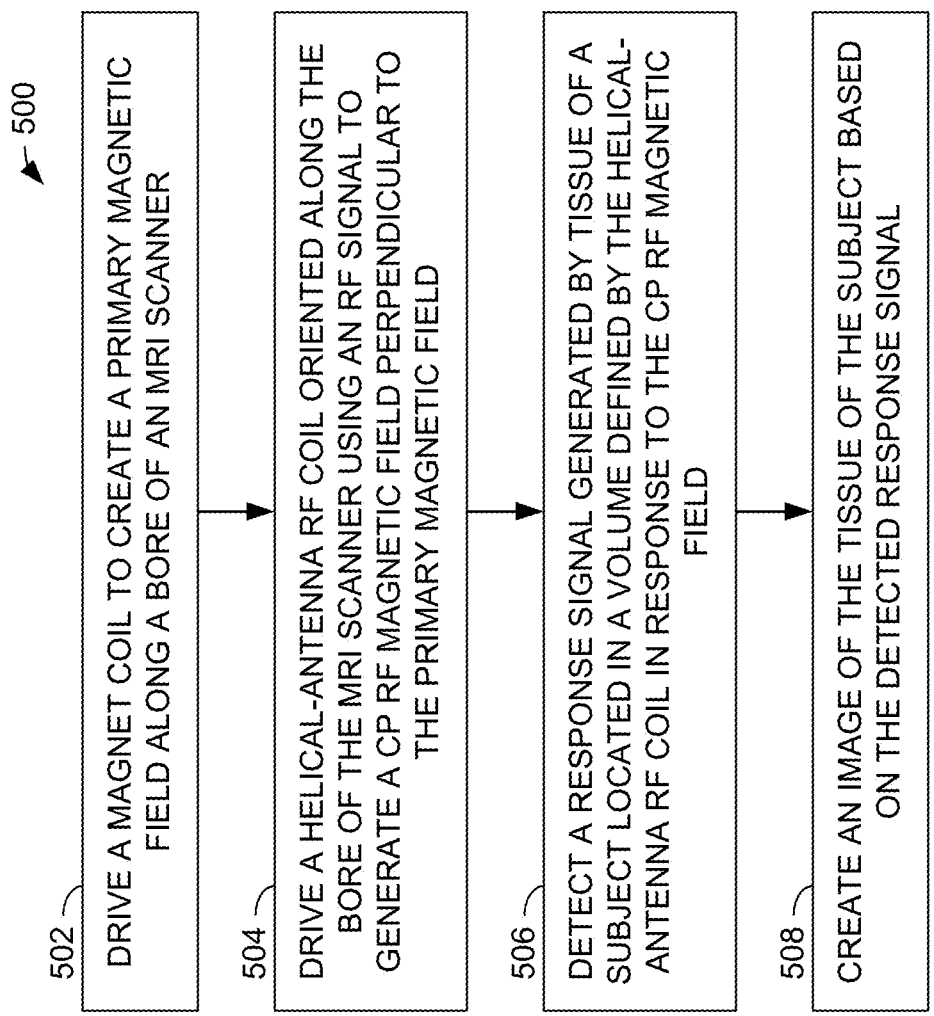
FIG. 5 is a flow diagram of an example method of MRI scanning using a subject-loaded helical-antenna RF coil.

FIG. 5 is a flow diagram of an example method 500 of MRI scanning using a subject-loaded helical-antenna RF coil, such as the helical-antenna RF coil 100 of FIG. 1, as well as other helical-antenna RF coils disclosed herein, employed within an MRI scanning system, such as the MRI scanning system 400 of FIG. 4. In the method 500, a magnet coil (e.g., magnet coil 404) may be driven to create a primary magnetic field along a bore of an MRI scanner (e.g., MRI scanning system 400) (operation 502). A helical-antenna RF coil (e.g., helical-antenna RF coil 100) oriented along the bore of the MRI scanner may be driven using an RF signal to generate a CP RF magnetic field perpendicular to the primary magnetic field (operation 504). A response signal generated by tissue of a subject located in a volume defined by the helical-antenna RF coil may be detected in response to the CP RF magnetic field (operation 506). An image of the tissue of the subject based on the detected response signal may be created (operation 508).

While the operations 502 through 508 are shown as being performed in a particular order, other orders for performing the operations 502 through 508 are also possible. For example, each of the operations 502 through 508 may be performed repeatedly for each portion of tissue of the subject being imaged. Moreover, execution of one or more of the operations 502 through 508 may be performed in a pipelined, overlapped, or otherwise concurrent or parallel manner. Other orders of performance of the operations 502 through 508 may also be possible.

FIGS. 6, 8A-B, and 9 depict example simulated combinations of helical-antenna RF coils and idealized subjects called "phantoms". Generally, a phantom is an object designed to react in a fashion similar to that of human or other animal tissue, but in a more consistent and predicable manner for evaluation and analysis of imaging devices, such as MRI scanners. Specifically in the examples of FIGS. 6, 8A-B, and 9, simulations were performed using a higher-order full-wave computational electromagnetics (CEM) technique based on the method of moments (MoM) in the surface integral equation (SIE) formulation. In this technique, all material (e.g., metallic and dielectric) surfaces in the structure were modeled using generalized parametric quadrilateral patches and all metallic wires were modeled by means of straight wire segments. Further, electric and magnetic equivalent surface currents over elements (e.g., quadrilateral patches and wire segments) were modeled by polynomial vector basis functions, and SIEs based on boundary conditions for electric and magnetic field vectors were solved employing the Galerkin method. In addition, the results obtained by the higher-order MoM-SIE technique were verified and validated by comparison with results using two commercial full-wave CEM codes: a MoM code, WIPL-D by the company of the same name; and a finite element method (FEM) code, HFSS by ANSYS®.

Figure 6:
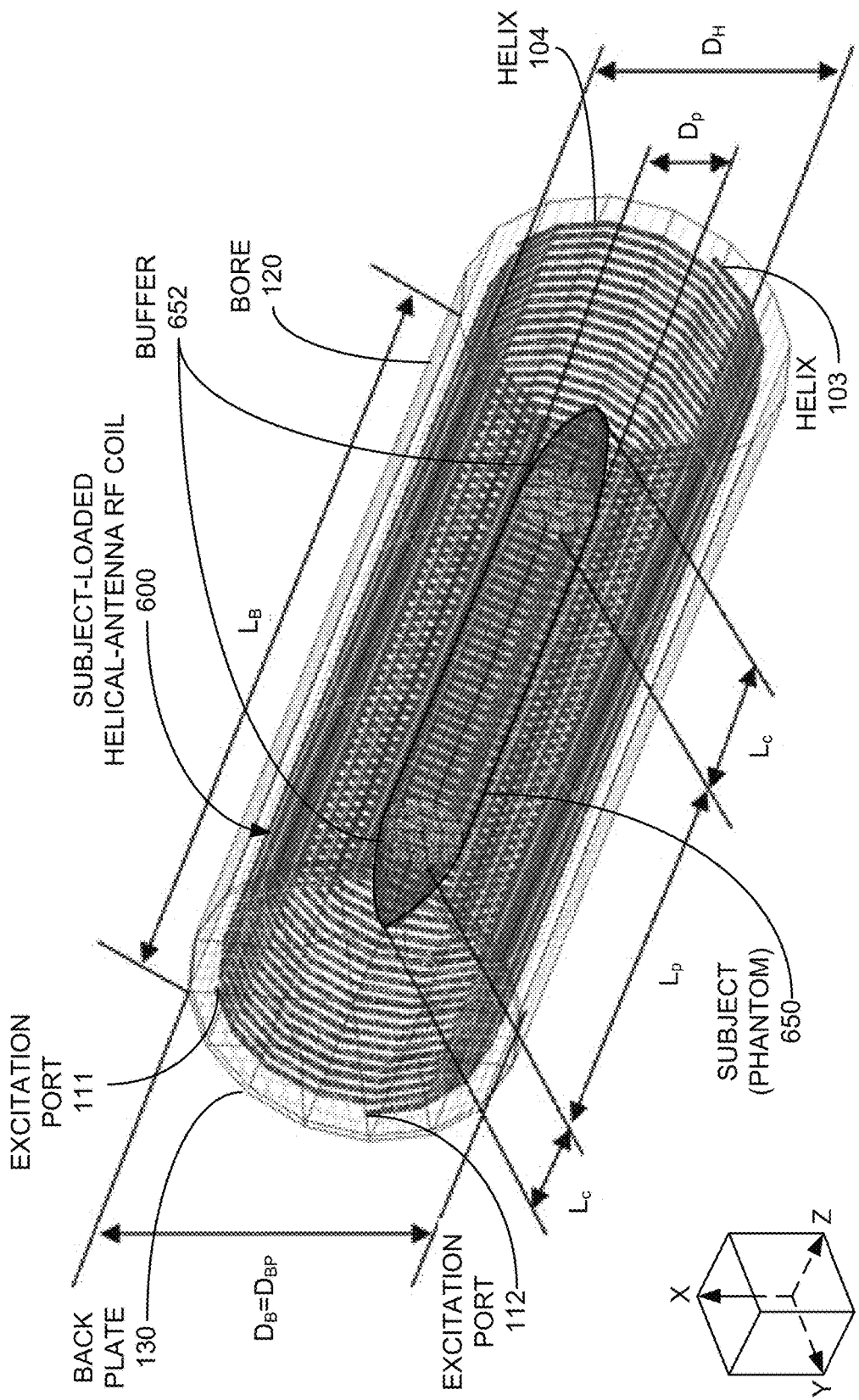
FIG. 6 is a perspective view of an example subject-loaded quadrifilar (four-channel) helical-antenna RF coil for use in MRI scanning.

FIG. 6 is a perspective view of an example subject-loaded quadrifilar (four-channel) helical-antenna RF coil 600 for use in an MRI scanning system (e.g., the MRI scanning system 400 of FIG. 4). Similar to the helical-antenna RF coil 100 of FIG. 1, the helical-antenna RF coil 600 is sized and oriented along a z-axis to fill the majority of a similarly-oriented bore 120 of the MRI scanner. The helical-antenna RF coil 600 includes four interleaved, coaxially-wound helices 101-104 (of which only helices 103 and 104 are specifically indicated in FIG. 4), each of which is driven by a corresponding excitation port 111-114 (of which only excitation ports 111 and 112 are explicitly indicated in FIG. 4) located between each helix 101-104 and a conductive back plate 130 serving as a ground plane. As in FIGS. 1 and 2, each excitation port 111-114 is driven using a corresponding sinusoidal voltage in quadrature with respect to the sinusoidal voltages driving the other excitation ports 111-114.

In reference to FIG. 6, the helical-antenna RF coil 600 was simulated using a bore diameter $D_B$=60 cm and a bore length $L_B$=200 cm. A phantom 650 within the helical-antenna RF coil 600 was simulated in the form of a cylinder filled with saline water of relative permittivity $\varepsilon_r$=81, conductivity σ=0.6 Siemens/meter (S/m), and relative permeability $\mu_r$=1, with a phantom diameter $D_p$=15 cm and a phantom length $L_p$=100 cm. The phantom 650 was also terminated at each end with paraboloidal buffers 652 of buffer length $L_c$=28 cm and also filled with saline water. The back plate 130 was simulated with a diameter $D_{BP}$=60 cm, and the magnitude of the RF excitation signals was V=14 V. The helical-antenna RF coil 600 was simulated with a wire diameter $d_w$=1 cm and a helix length equal to the bore length $L_B$=200 cm. The helical-antenna RF coil 600 also was simulated with a helix diameter $D_H$ and a pitch P that were set depending on the strength of the particular primary magnetic field $B_0$ imposed.

Figure 7A:
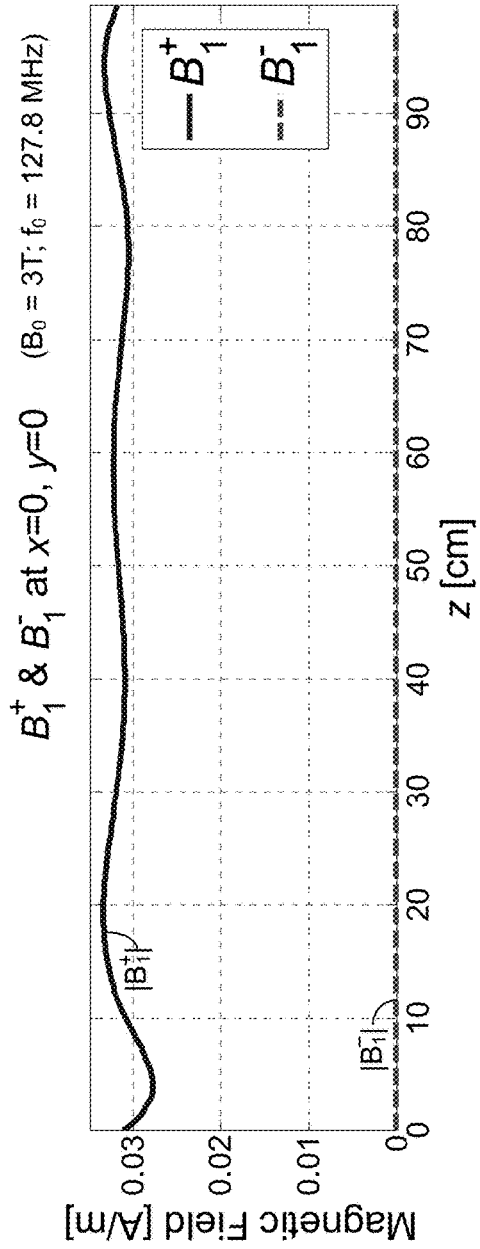
FIGS. 7A and 7B are graphs of expected transverse excitation magnetic fields along a longitudinal axis of a bore using the helical-antenna RF coil of FIG. 6.
Figure 7B:
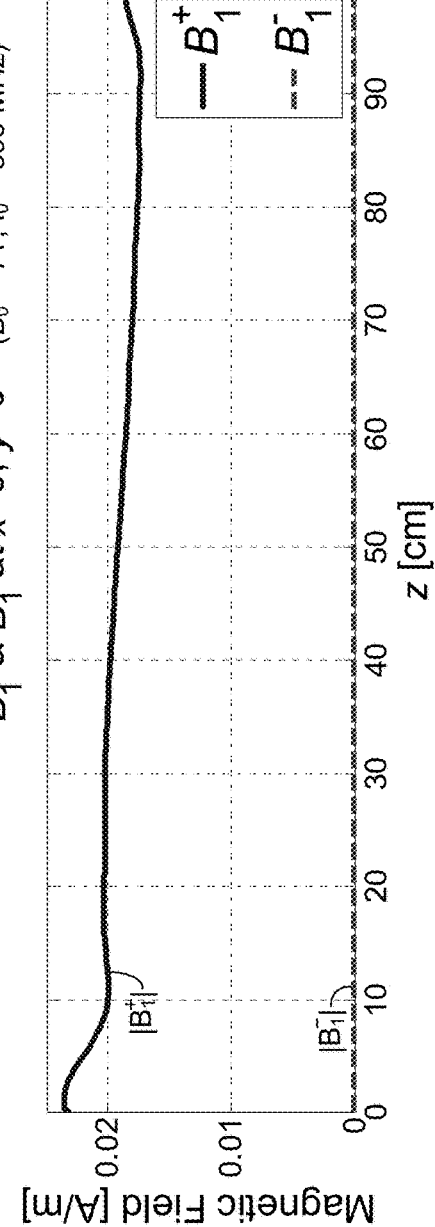

FIGS. 7A and 7B are graphs of expected components of the transverse excitation magnetic field $B_1$ (e.g., the RCP component magnitude $|B_1^+|$ and the LCP component magnitude $|B_1^-|$) along the length of the phantom 650 located at the central longitudinal axis of the bore 120 within which the helical-antenna RF coil 600 of FIG. 6 resided. With reference to FIG. 7A, a primary magnetic field $B_0$=3 T and a corresponding Larmor frequency $f_0$=127.8 MHz was employed in one simulation, along with a helix diameter $D_H$=50 cm and a pitch P=12.8 cm. As seen in FIG. 7A, the magnitude of the LCP component $|B_1^-|$ was essentially zero along the entire length of the phantom 650, resulting in an axial ratio AR=1 and a nearly perfectly-RCP $B_1^+$ field along the z-axis. The magnitude of the RCP component $|B_1^+|$ was simulated to be quite uniform along the z-axis within the phantom 650. These same simulation results were also noted throughout the volume of the phantom 650. Moreover, a strong coupling of the RCP component of the transverse magnetic field $B_1$ with the phantom 650, as well as a strong field throughout the phantom 650, were observed via a calculated distribution of the real part of the z-component of the Poynting vector, Re{$P_z$}, which represents the energy flux density of an electromagnetic field in the z-direction.

With reference to FIG. 7B, a primary magnetic field $B_0$=7 T and a corresponding Larmor frequency $f_0$=300 MHz was employed in another simulation, along with a helix diameter $D_H$=31 cm and a pitch P=10.67 cm. As depicted in FIG. 7B, the magnitude of the LCP component $|B_1^-|$ was again essentially zero along the entire length of the phantom 650, resulting in an axial ratio AR=1 and a near-perfectly RCP $B_1^+$ field along the z-axis. The magnitude of the RCP component $|B_1^+|$ was simulated to be substantially uniform along the z-axis within the phantom 650. These same simulation results were also noted throughout the volume of the phantom 650. In addition, strong coupling and penetration of the RCP component of the transverse magnetic field $B_1$ with respect to the phantom 650 were again observed. Also with respect to this example, the specific absorption rate (SAR) for the given typical or maximal total input RF power of the system was simulated to be well below the allowable prescribed SAR level at each point within the phantom 650.

Figure 8A:
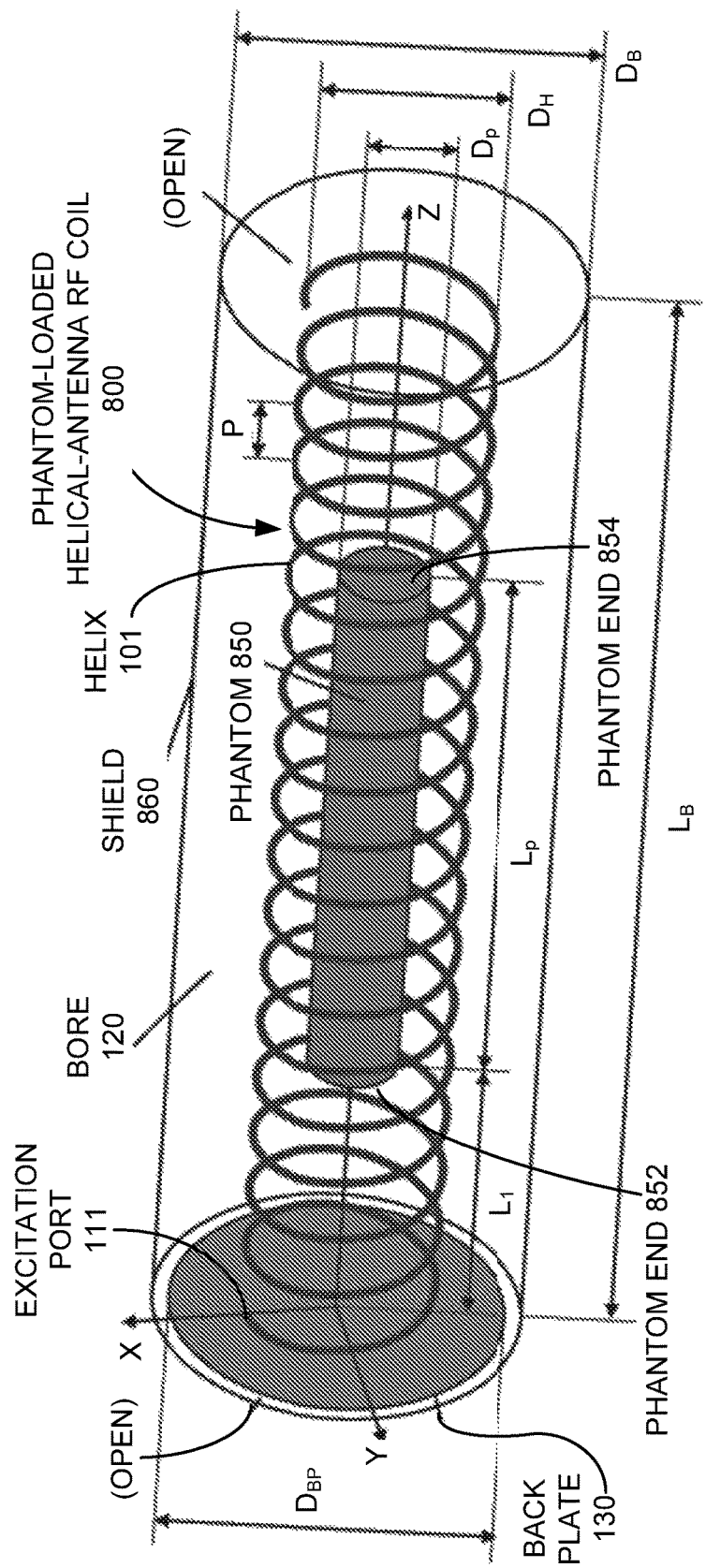
FIG. 8A is a perspective view of an example subject-loaded monofilar (single-channel) helical-antenna RF coil for use in MRI scanning.

FIG. 8A is a perspective view of a simulated example subject-loaded monofilar (single-channel) helical-antenna RF coil 800 for use in MRI scanning. In this example, a circular conductive back plate 130 that is slightly smaller than the bore 120 and offset 1.8 cm toward the inside of the bore 120 was used. More specifically in reference to FIG. 8A, the simulation employed a cylindrical phantom 850 located a distance $L_1$=50 cm from the back plate 130 and having a length $L_p$=100 cm and a diameter $D_p$=15 cm, and with the bore 120 having a diameter $D_B$=60 cm. As with the example of FIG. 6, the phantom 850 was filled with saline water of relative permittivity $\in_r$=81, conductivity σ=0.6 S/m, and relative permeability $\mu_r$=1. The back plate 130 was simulated with a diameter $D_{BP}$=56 cm, and the incident power of the RF excitation signals was $P_{inc}$=1 watt (W). The helical-antenna RF coil 800 was simulated with a wire diameter $d_w$=1 cm, a helix length equal to the bore length $L_B$=200 cm, a helix diameter $D_H$=32 cm, and a pitch P=11.5 cm.

Using a primary magnetic field $B_0$=7 T and its associated Larmor frequency $f_0$=300 MHz, excellent field uniformity was observed throughout an entire length of the phantom 850, with a substantially higher RCP component $|B_1^+|$ compared to a near-zero LCP component $|B_1^-|$. In this example, an even higher magnitude of the RCP component $|B_1^+|$ was observed at a first end 852 and a second end 854 of the phantom 850 due to strong reflections appearing at the abrupt material discontinuity between the phantom 850 and the simulated air. Such a phenomenon was not observed in the example of the helical-antenna RF coil 600 of FIG. 6 due to the presence of the conical buffers of the phantom 650. Thus, this behavior may be mitigated by such buffers to provide impedance matching between the medium of the phantom 850 and the surrounding air.

Figure 8B:
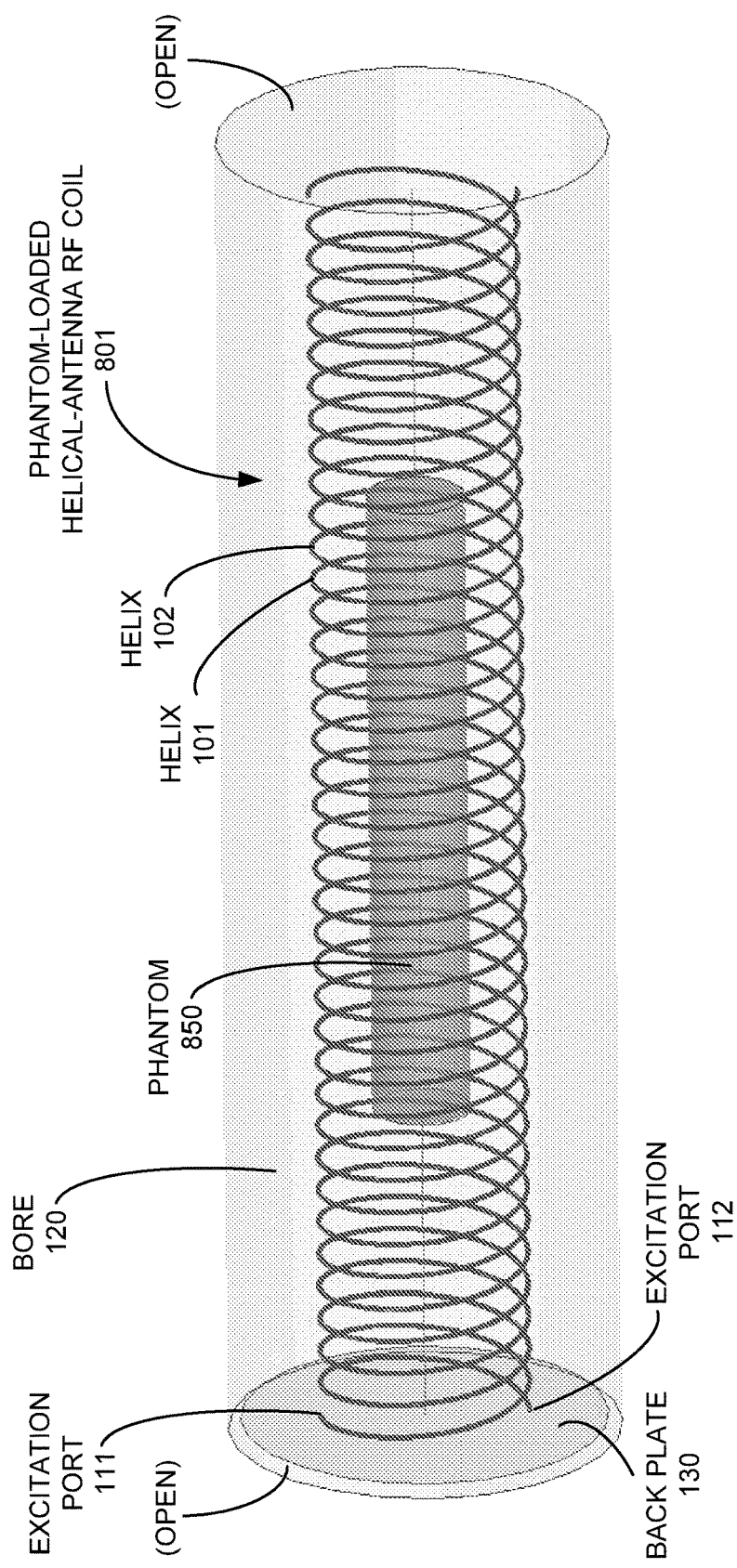
FIG. 8B is a perspective view of an example subject-loaded bifilar (dual-channel) helical-antenna RF coil for use in MRI scanning.

FIG. 8B is a perspective view of a simulated example subject-loaded bifilar (dual-channel) helical-antenna RF coil 801 for use in MRI scanning. The bifilar helical-antenna RF coil 801 includes a first helix 101 and a second helix 102. The first helix 101 and the second helix 102 are interleaved and are configured to be coupled to an RF signal generator (such as the RF source 416 of FIG. 4) to drive the first helix 101 and the second helix 102 with corresponding time-varying voltages in counter-phase. The first helix 101 and the second helix 102 extend about a bore 120 such that, when a phantom 850, body, or other object is disposed within the bore 120, the first helix 101 and the second helix 102 at least partially surround the phantom 850. Each of the first helix 101 and second helix 102 are coupled to a back plate 130 by excitation ports 111, 112, respectively, such that the first helix 101 and the second helix 102 may be provided with RF signals from an RF generator.

Figure 9:
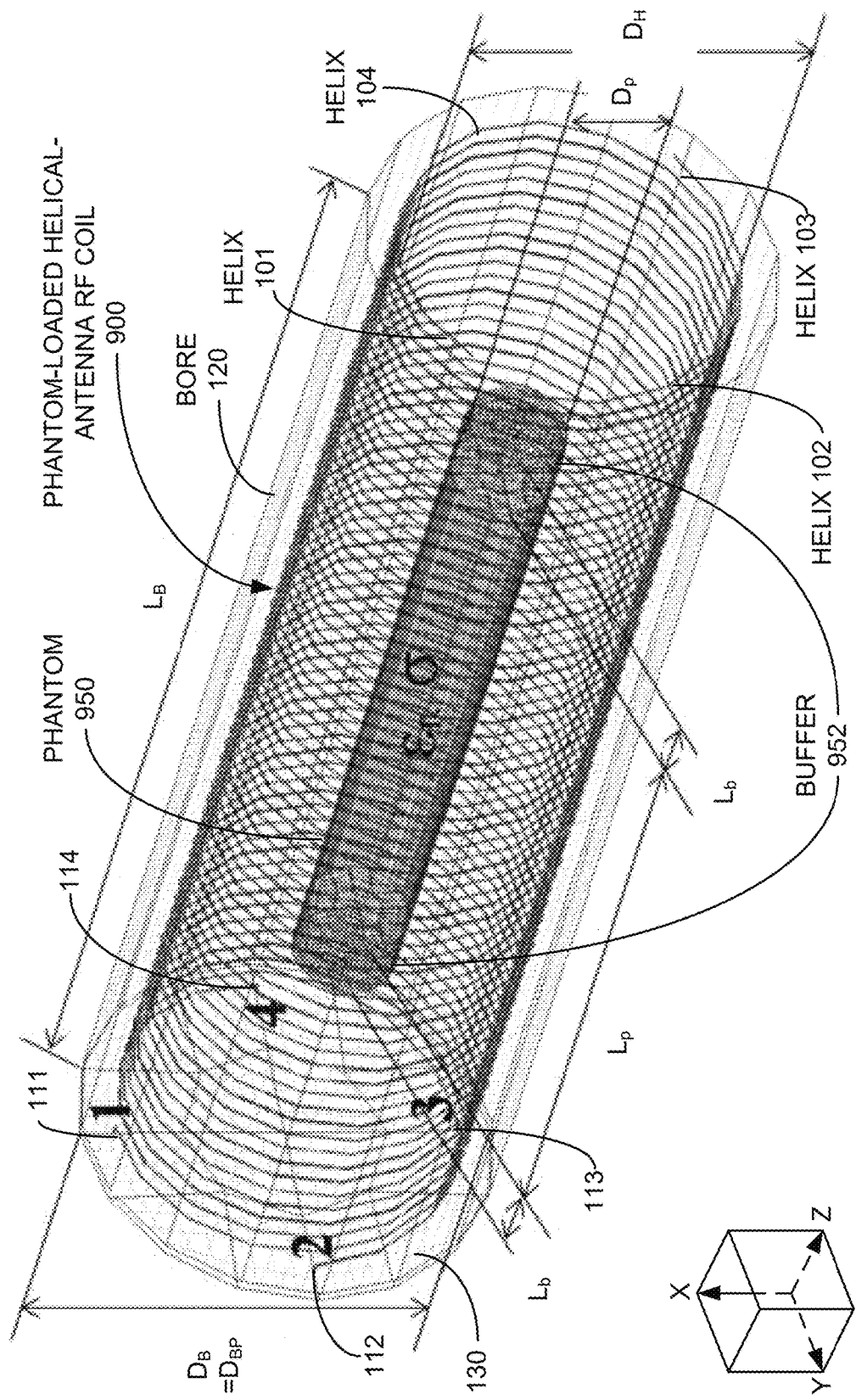
FIG. 9 is a perspective view of an example subject-loaded quadrifilar (four-channel) helical-antenna RF coil for use in MRI scanning.

FIG. 9 is a perspective view of a simulated example subject-loaded quadrifilar (four-channel) helical-antenna RF coil 900 for use in MRI scanning. The quadrifilar helical-antenna RF coil 900 includes four interleaved, coaxially-wound helices 101-104, each of which is driven via a corresponding excitation port 111-114, respectively, with each port 111-114 connected between its helix 101-104 and a conductive back plate 130, in a manner similar to that of the helical-antenna RF coil 600 of FIG. 6. Further, each excitation port 111-114 is located one-quarter rotation of the back plate 130 from each of two of the remaining ports 111-114, also as depicted in FIG. 6.

The helical-antenna RF coil 900 is loaded with a simulated cylindrical phantom 950 filled with saline water having the same conductivity, permittivity, and permeability properties as the phantoms 650 and 850 discussed above. In addition, a cylindrical buffer 952 of the same diameter and saline water fill as the phantom 950 was simulated at each end of the buffer 952 to mitigate abrupt field changes and wave reflections due to material discontinuities between the medium and the surrounding air.

In a first simulated example for the helical-antenna RF coil 900, the primary magnetic field $B_0$=3T, the Larmor frequency $f_0$=127.8 MHz, the bore 120 length $L_B$=200 cm, the bore 120 diameter $D_B$=60 cm, the helix diameter $D_H$=50 cm, the helix length $L_H$=200 cm, the helix pitch P=12.8 cm, the helix wire radius $r_w$=0.1 cm, and the back plate 130 diameter $D_{BP}$=60 cm, with the back plate 130 being located 1.5 cm away from the left end of the bore 120. Also in this example, the phantom diameter $D_p$=15 cm, as do the diameter of the buffers 952. The length of the phantom 950 $L_p$=100 cm, while the length of each buffer 952 $L_b$=10 cm. In this example, a near-zero LCP component |$B_1^-$| and a RCP component |$B_1^+$| having exceptionally small variation within the phantom 950 along the z-axis of the bore 120 was observed, as was the case with the previous examples discussed earlier. Also, analysis of the $B_1^-$ and $B_1^+$ components at the coronal/sagittal and axial cross-sections of the phantom 950 showed an almost perfect spatial uniformity of the $B_1^+$ component and a near-zero $B_1^-$ component throughout the phantom.

In another set of simulated examples for the helical-antenna RF coil 900, several alterations were made regarding the helix diameter $D_H$, the phantom 950 length $L_p$, and other dimensional parameters involving the helical-antenna RF coil 900, the bore 120, and the size and position of the phantom 950. In addition, various types of dielectrics (e.g., vegetable oil, saline water, and water) were simulated for the phantom 950. In general, results from the simulations indicated that the quadrifilar helical-antenna RF coil 900 provided field uniformity in the transverse (x and y) direction comparable to a typical "birdcage" coil design, as mentioned above, but yielded dramatic improvement in field uniformity in the longitudinal (z) direction for all types of the phantoms 950 simulated when compared to the birdcage coil. Also, with respect to these examples, the SARs simulated were below the allowable prescribed SAR level within the phantom 950.

Figure 9A:
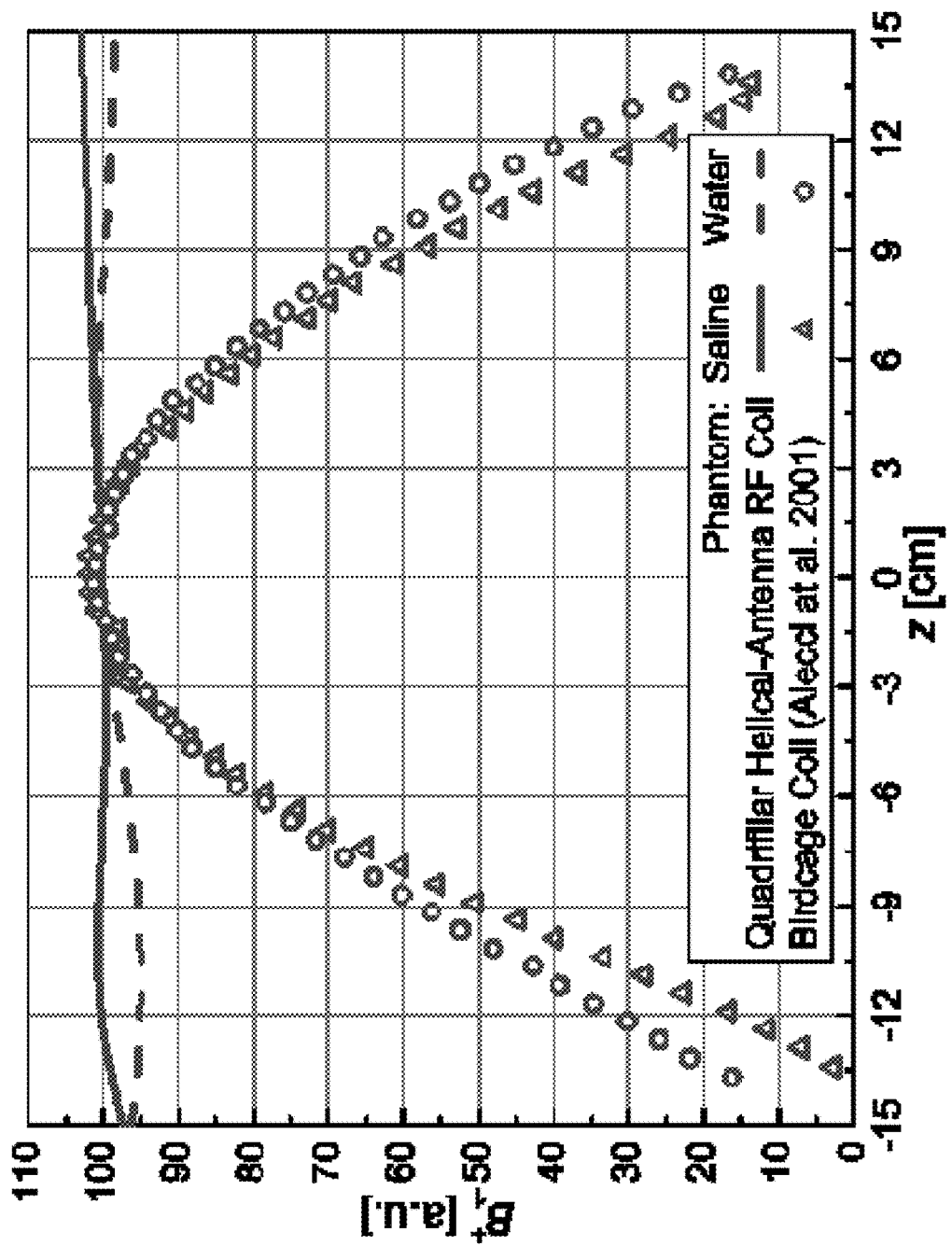
FIG. 9A is a graph of simulated transverse excitation magnetic fields along a longitudinal axis of a bore using the helical-antenna RF coil of FIG. 9 compared to experimental results for a "birdcage" RF coil.

FIG. 9A is a graph of the simulated RCP component magnitude |$B_1^+$| of the transverse excitation magnetic field $B_1$ along the length of the phantom 950 located at the central longitudinal axis of the bore 120 within which the helical-antenna RF coil 900 of FIG. 9 resided. The helical-antenna RF coil 900 was simulated with a phantom 950 in the form of a cylinder filled with saline water of relative permittivity $\varepsilon_r$=78 and conductivity $\sigma$=1.67, or water of relative permittivity $\varepsilon_r$=74, conductivity $\sigma$=0, and relative permeability $\mu_r$=1, with a phantom diameter $D_p$=15 cm and a phantom length $L_p$=38 cm. The phantom 950 was also terminated at each end with cylindrical buffers 952 filled with same material as the phantom 950. The helix diameter was $D_H$=58 cm and a helix pitch P=12.8 cm was used in this example. As depicted in FIG. 9A, the magnitude of the RCP component |$B_1^+$| was simulated and compared with experimental results for the 16-element quadrature birdcage coil from [M. Alecci et al., "Radio frequency magnetic field mapping of a 3 T birdcage coil: experimental and theoretical dependence on sample properties," *Magn. Reson. Med.*, vol. 46, pp. 379-385, August 2001]. FIG. 9A shows one-dimentional (1-D) field distributions in the longitudinal direction (coronal/sagittal cross section) along the z-axis (x=y=0). The results were normalized with respect to $B_1$ at the center of the phantom 950 and given in "arbitrary units" (a.u.). The helical-antenna RF coil 900 yielded a dramatic improvement in the field uniformity in the longitudinal direction as compared to the birdcage coil results.

Figure 10:
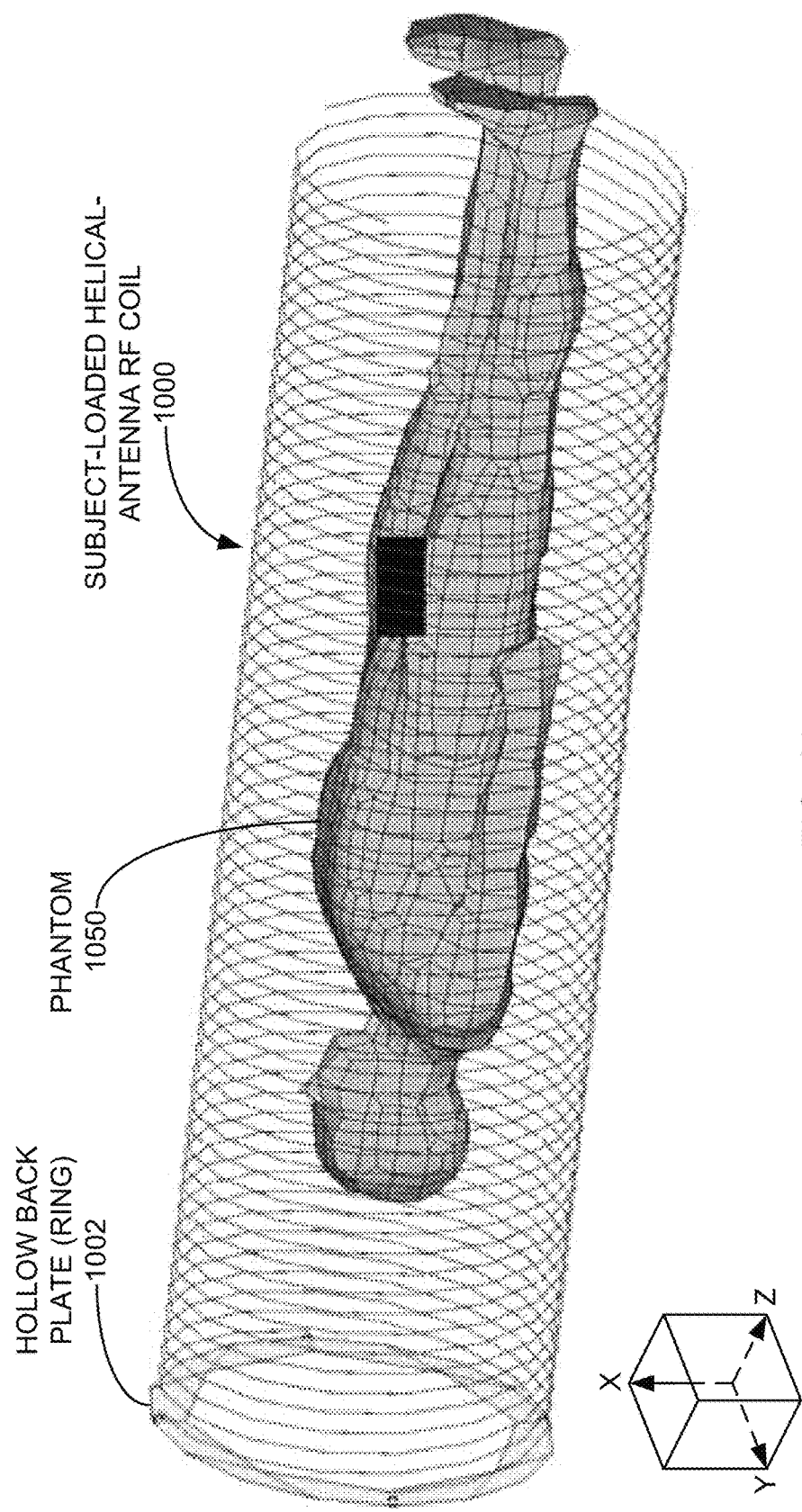
FIG. 10 is a perspective view of an example subject-loaded quadrifilar (four-channel) helical-antenna RF coil, employed in conjunction with a hollow back plate, for use in MRI scanning.

FIG. 10 is a perspective view of an example subject-loaded quadrifilar (four-channel) helical-antenna RF coil 1000 similar in design to the quadrifilar helical-antenna RF coil 900 of FIG. 9, but employed in conjunction with a hollow back plate or ring 1002 instead of the solid back plate 130 of FIG. 9. The ring 1002 was simulated with an inner diameter of 50 cm and an outer diameter of 60 cm, and was placed within the bore, 1.5 cm away from the bore (not explicitly shown in FIG. 10). In addition, the simulated cylindrical phantoms employed above were replaced with a homogeneous human body phantom 1050 filled with a lossy dielectric of averaged tissue parameters amounting to a relative permittivity $\varepsilon_r$=31 and a conductivity $\sigma$=0.31 S/m. The simulated phantom 1050 also exhibited a length of 184 cm and a maximum width of 52 cm. In one simulation, a very small LCP field component $B_1^-$ compared to the RCP component $B_1^+$, as well as reasonable spatial uniformity of the RCP component $B_1^+$, were observed along the z-axis from the top of the "head" to the end of the "torso" of the simulated phantom 1050, except in the "neck" area at about 20-30 cm from the top of the head. In that particular region, the simulated maximum $B_1^+$ variation was 61.5%.

Figure 11:
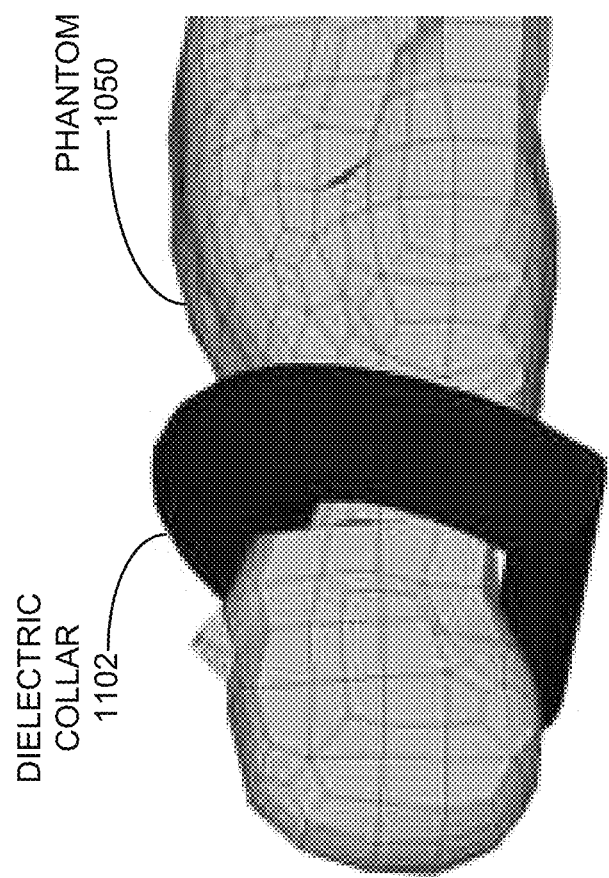
FIG. 11 is a perspective view of an example subject outfitted with a dielectric collar for use with the quadrifilar helical-antenna RF coil of FIG. 10.

To mitigate the field loss at the neck area, a simulated dielectric "collar" of the same properties as the human body phantom 1050 was employed and tested. FIG. 11 is a perspective view of the phantom 1050 outfitted with a dielectric collar 1102 for use within the quadrifilar helical-antenna RF coil 1000 of FIG. 10. Significant reduction in field variation of the RCP component $B_1^+$ from the 61.5% (noted above) to 22% was observed.

Figure 12:
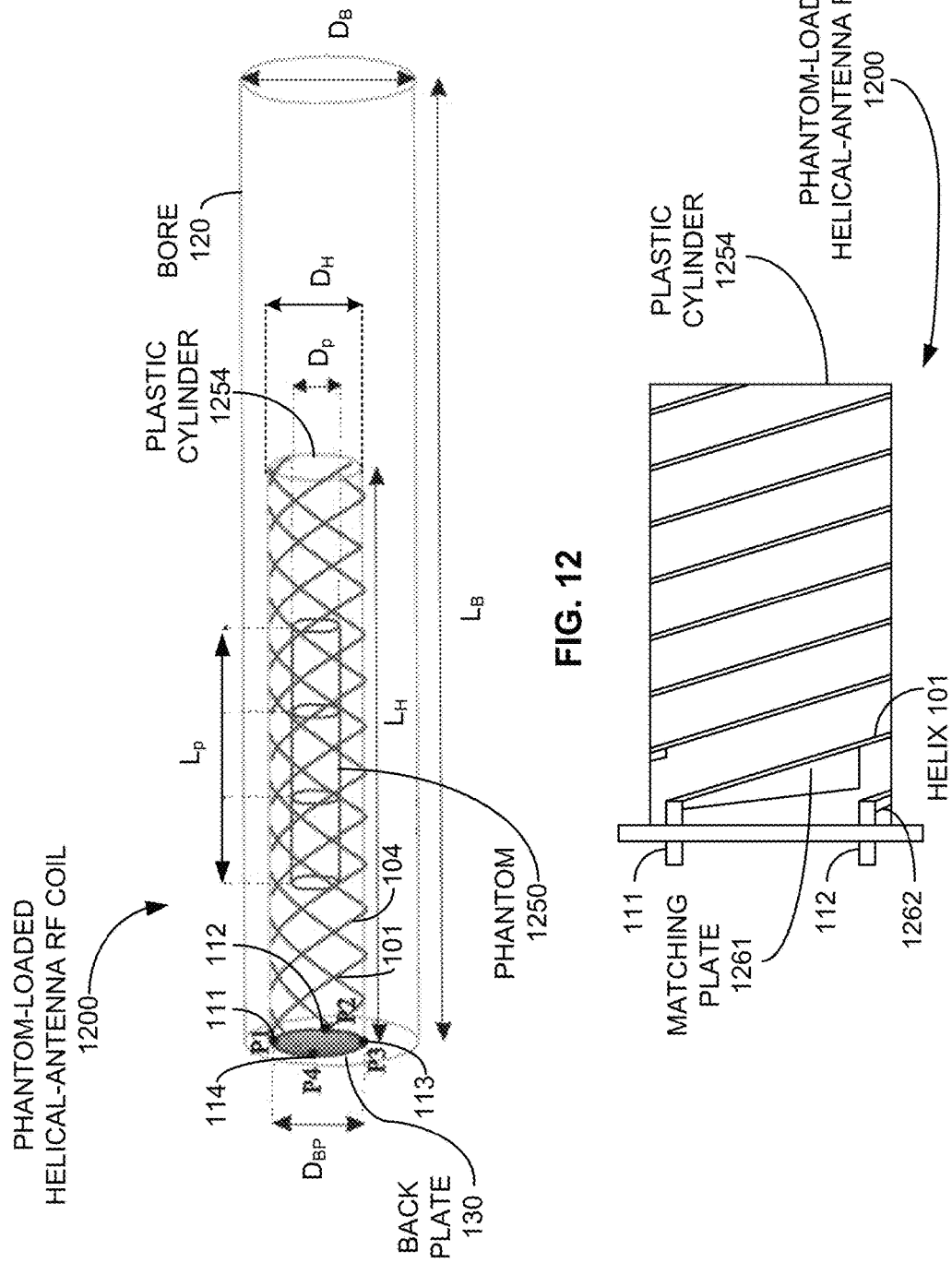
FIG. 12 is a perspective view of an example subject-loaded quadrifilar (four-channel) helical-antenna RF coil for use in MRI scanning.
Figure 13:
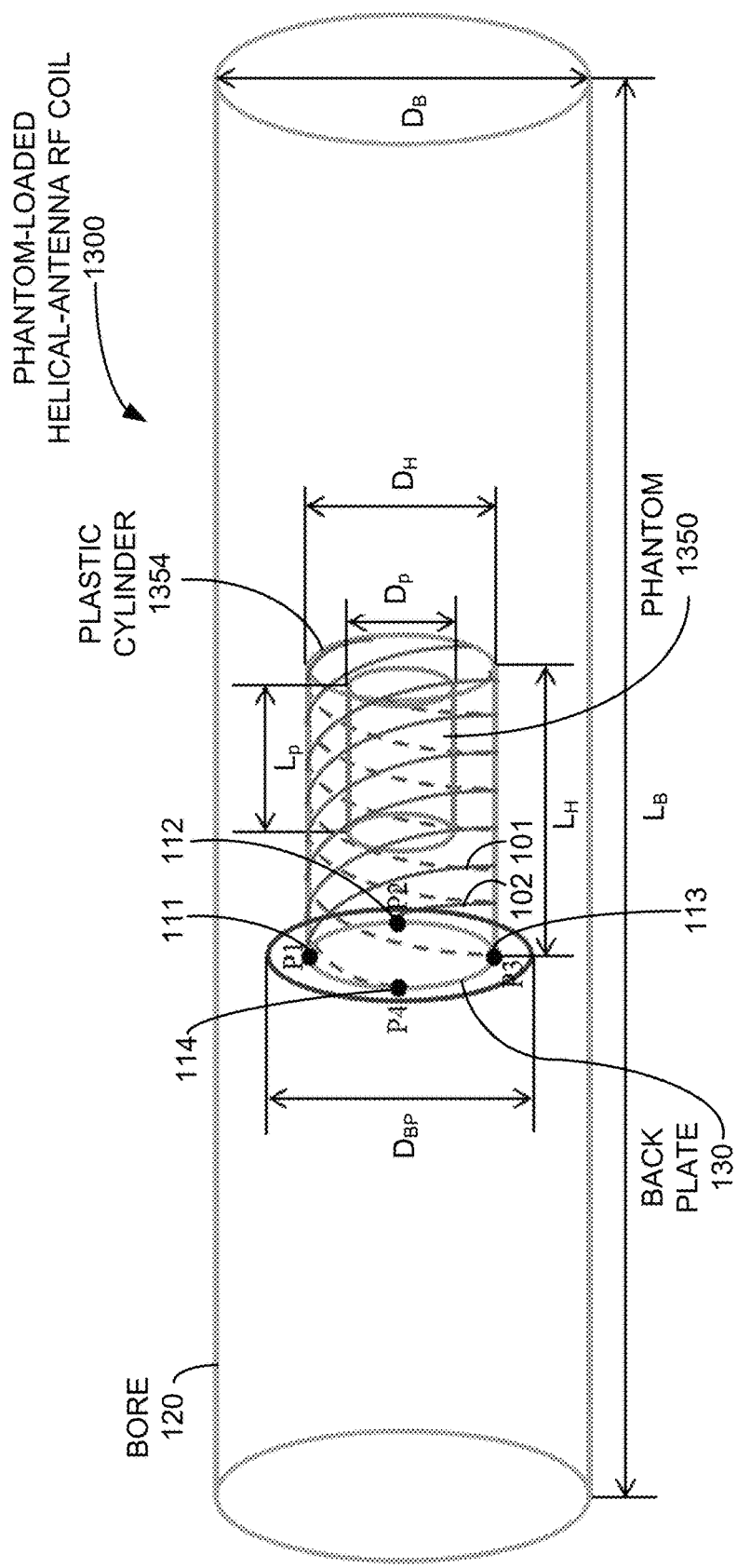
FIG. 13 is a perspective view of an example subject-loaded quadrifilar (four-channel) helical-antenna RF coil for use in MRI scanning.
Figure 14:
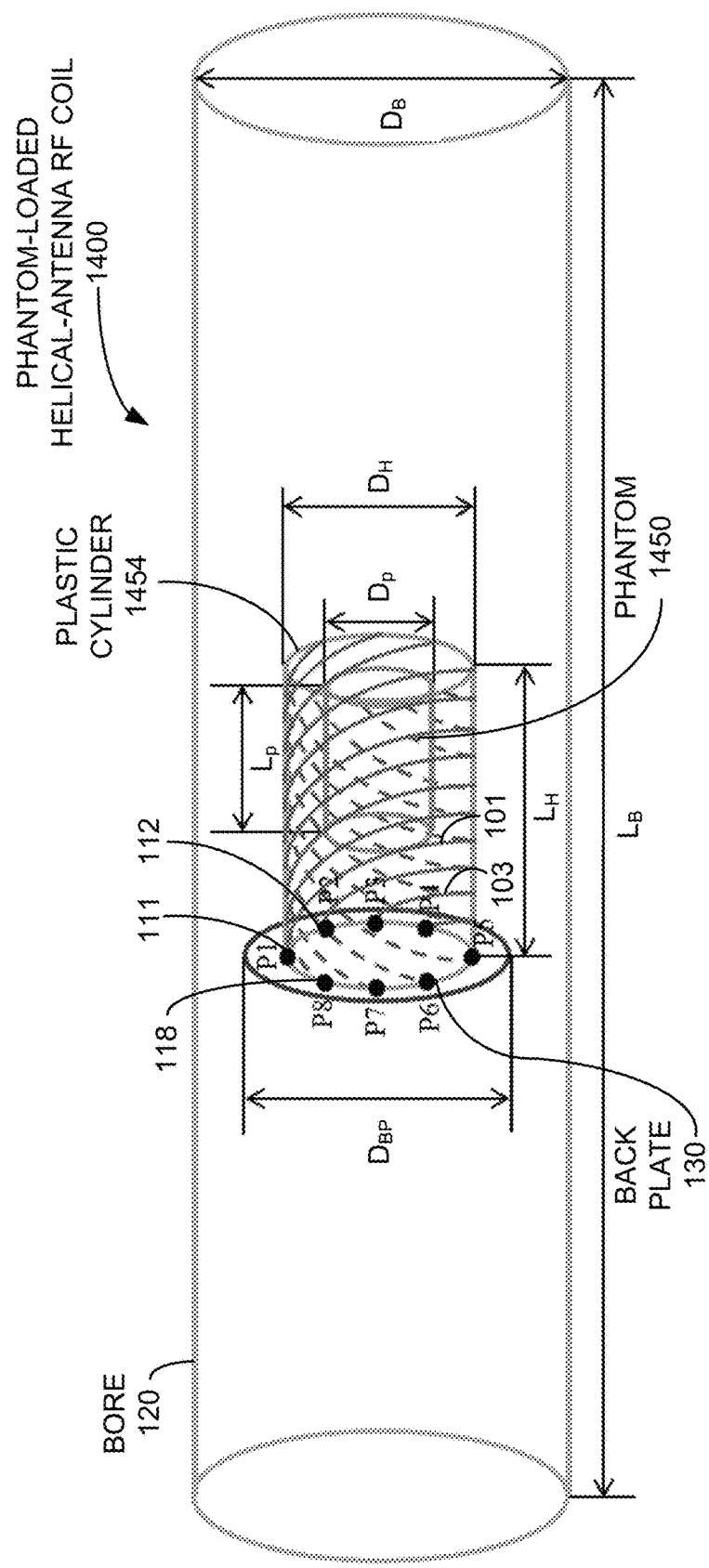
FIG. 14 is a perspective view of an example subject-loaded octafilar (eight-channel) helical-antenna RF coil for use in MRI scanning.

FIGS. 12 through 14 provide perspective views of example subject-loaded helical-antenna RF coil prototypes built and subsequently analyzed using an MRI system testing facility under various conditions. In each example, each helical-antenna RF coil employed was RCP in orientation, as each of those described above, although an LCP orientation is possible in other embodiments. Also, the helical-antenna RF coils prototyped in these examples were coaxially wound about a large polyvinyl chloride (PVC) (e.g., the plastic cylinder 1254 of FIG. 12) as a substrate, although other types of materials may serve as a substrate in other implementations, while other helical-antenna RF coils may not require such a substrate.

For example, FIG. 12 is a perspective view of an example prototyped subject-loaded quadrifilar (four-channel) helical-antenna RF coil 1200. For analysis, a bore 120 having a length $L_B$=3.365 m and diameter $D_B$=59 cm was employed. As with some of the examples described above, the quadrifilar helical-antenna RF coil 1200 included four coaxially-wound, interleaved helices 101-104, each driven by way of a corresponding excitation port 111-114 (also labeled P1-P4 in FIG. 12) implemented using a BNC connector connected between its helix 101-104 and a conductive back plate 130, and positioned at each one-quarter rotation about the back plate 130. In this particular embodiment, the overall diameter of the back plate $D_{BP}$=35 cm.

In one example, one or more of the helices 101-104 was augmented with an impedance matching plate designed to match the impedance of the helix 101-104 with the output impedance of its corresponding excitation port 111-114. FIG. 12A is a side view of the helical-antenna RF coil 1200 highlighting the use of a matching plate 1261 for helix 101. In this example, the matching plate 1261 may be copper tape or a copper strip of varying width that is conductively connected (e.g., soldered) to the helix 101 from the corresponding excitation port 111 for a quarter-turn of the helix 101 and alongside the helix 101, at which point the matching plate 1262 for the next helix 102 begins at its excitation port 112. In some embodiments, as shown in FIG. 12A, the matching plate 1261 is attached along the side of the helix 101 closest to the back plate 130. Use of the matching plates for each helix 101-104 facilitated desirable impedance matching characteristics for the helices 101-104 (e.g., a return loss better than 10 decibels (dB)), measured in free space using a network analyzer.

Dimensions for the prototype helical-antenna RF coil 1200 included a helix length $L_H$=200 cm, a helix diameter $D_H$=31.75 cm, and a helix wire thickness equal to 2.05 mm (12 American Wire Gauge (AWG) copper wire), and a pitch P=10.6 cm. Analysis involved the use of a saline-filled cylindrical phantom 1250 having a diameter $D_p$=16 cm and a length $L_p$=37 cm, without buffers.

Overall, results of the analysis of the prototype quadrifilar helical-antenna RF coil 1200 driven by excitation voltages in quadrature, as discussed above, using a primary magnetic field $B_0$=7 T and a corresponding Larmor frequency $f_0$=300 MHz, were qualitatively very similar to the quadrifilar helical-antenna RF coil simulations discussed above with respect to transverse magnetic field component intensity and uniformity, as well as other aspects.

FIG. 13 is a perspective view of an example subject-loaded quadrifilar (four-channel) helical-antenna RF coil 1300 prototype, possibly sized for use in partial-body MRI scanning. As with the quadrifilar helical-antenna RF coil 1200 of FIG. 12, the quadrifilar helical-antenna RF coil 1300 included four coaxially-wound, interleaved helices 101-104 and corresponding excitation ports 111-114 (also labeled P1-P4 in FIG. 12) attached to a back plate 130 in a manner similar to that discussed above in connection with FIG. 12. The overall diameter of the back plate $D_{BP}$=38 cm in each prototype associated with FIG. 13. Also, one or more of the helices 101-104 was coupled with a matching plate similar to the matching plate 1261 of FIG. 12A, thus producing similar benefits in impedance matching.

One example of the prototype helical-antenna RF coil 1300 was analyzed using a primary magnetic field $B_0$=7 T and a corresponding Larmor frequency $f_0$=300 MHz. Dimensions for this example of the prototype helical-antenna RF coil 1300 included a helix length $L_H$=60 cm, a helix diameter $D_H$=32 cm, a helix wire width equal to 6 mm, and a helix wire depth equal to 35 micron (μm) (e.g., using 35-μm-thick copper tape). Analysis involved the use of a saline-filled cylindrical phantom 1350 having a diameter $D_p$=16 cm and a length $L_p$=37 cm, without buffers, placed at a distance of about 23 cm from the back plate 130 and centered at the isocenter of the bore 120, with the bore 120 length $L_B$=3.36 m, and the bore diameter $D_B$=90 cm. The prototype quadrifilar helical-antenna RF coil 1300 was driven by RF excitation voltages in quadrature, as indicated in FIG. 2.

A second example of the prototype helical-antenna RF coil 1300 was analyzed using a primary magnetic field $B_0$=10.5 T and a corresponding Larmor frequency $f_0$=450 MHz. Dimensions for the second prototype based on the quadrifilar helical-antenna RF coil 1300 included a helix length $L_H$=60 cm and a helix diameter $D_H$=21 cm using the same 35 μm copper tape mentioned above for the helices 101-104. Also, the same saline-filled cylindrical phantom 1350 employed in the first example of FIG. 13 was used for analysis, again without buffers, and placed approximately 23 cm from the back plate 130 and centered at the isocenter of the bore 120, with the bore 120 length $L_B$=4.1 m, and the bore diameter $D_B$=90 cm. This second example prototype quadrifilar helical-antenna RF coil 1300 was also driven by RF excitation voltages in quadrature.

FIG. 14 is a perspective view of an example subject-loaded octafilar (eight-channel) helical-antenna RF coil 1400 prototype, also sized for use in partial-body MRI scanning. The octafilar helical-antenna RF coil 1400 included eight coaxially-wound, interleaved helices 101-108 (of which only helices 101 and 103 are explicitly labeled in FIG. 14 for simplicity) and corresponding excitation ports 111-118 (of which only excitation ports 111, 112, and 118 are explicitly labeled in FIG. 14, but are also denoted as P1-P8) attached to a back plate 130. The back plate 130 in this example has a diameter $D_{BP}$=38 cm. Additionally, an impedance matching plate (e.g., the matching plate 1261 of FIG. 12A) was connected to one or more of the helices 101-108 to provide similar benefits in impedance matching as in the embodiments of FIGS. 12 and 13. In this example, each matching plate extended one-eighth of a revolution along its corresponding helix 101-108 from its associated excitation port 111-118 up to the circumferential position of the excitation port 111-118 of the next helix 101-108. However, other configurations for the matching plate for the embodiments of the FIGS. 12 and 13 are also possible.

One example of the prototype helical-antenna RF coil 1400 was analyzed using a primary magnetic field $B_0$=7 T and an associated Larmor frequency $f_0$=300 MHz. Dimensions for this example of the prototype helical-antenna RF coil 1400 included a helix length $L_H$=65 cm, a helix diameter $D_H$=32 cm, and a helix wire width equal to 6 mm, using the same 35 μm copper tape mentioned above for the helices 101-108. Analysis involved the use of a saline-filled cylindrical phantom 1450 having a diameter $D_p$=16 cm and a length $L_p$=37 cm, without buffers, placed at a distance of about 23 cm from the back plate 130 and centered at the isocenter of the bore 120, with the bore 120 length $L_B$=3.36 m, and the bore diameter $D_B$=90 cm. The prototype octafilar helical-antenna RF coil 1400 was driven by RF excitation voltages in octature. In other words, the excitation sinusoidal voltage for a particular port (e.g., excitation port 113) is delayed in phase by 45 degrees relative to the previous port (e.g., excitation port 112). Consequently, in response to the RF excitation signals, the octafilar helical-antenna RF coil 1400 prototypes generate an RCP transverse magnetic field $B_1$, similar to those described above.

A second example of the prototype helical-antenna RF coil 1400 was analyzed using a primary magnetic field $B_0$=10.5 T and a corresponding Larmor frequency $f_0$=450 MHz. Dimensions for this second prototype based on the octafilar helical-antenna RF coil 1400 included a helix length $L_H$=60 cm and a helix diameter $D_H$=21 cm using the same 35 μm copper tape mentioned above for the helices 101-108. Also, the same saline-filled cylindrical phantom 1450 employed in the first example of FIG. 14 was used for analysis, also without buffers, and placed approximately 23 cm from the back plate 130 and centered at the isocenter of the bore 120, with the bore 120 length $L_B$=4.1 m, and the bore diameter $D_B$=90 cm. This second example prototype octafilar helical-antenna RF coil 1400 was also driven by RF excitation voltages in octature.

Analysis of the prototypes for the helical-antenna RF coils 1300 and 1400 of FIGS. 13 and 14 indicates significant improvements over the prototype helical-antenna RF coil 1200 of FIG. 12, including increased power efficiency and augmented power delivered to the phantoms 1350 and 1450. Other desirable aspects of the systems, such as high transverse field strength and uniformity throughout the phantoms 1350 and 1450, were achieved as well.

FIGS. 15A, 15B, 16-19, and 20 illustrate various additional embodiments incorporating various characteristics not specifically reflected in the various simulations and prototypes explicated above. While each embodiment discussed below employs a particular number of helices (e.g., one, two, four, and so on), other numbers of helices may be employed for each example in other embodiments.

Figure 15A:
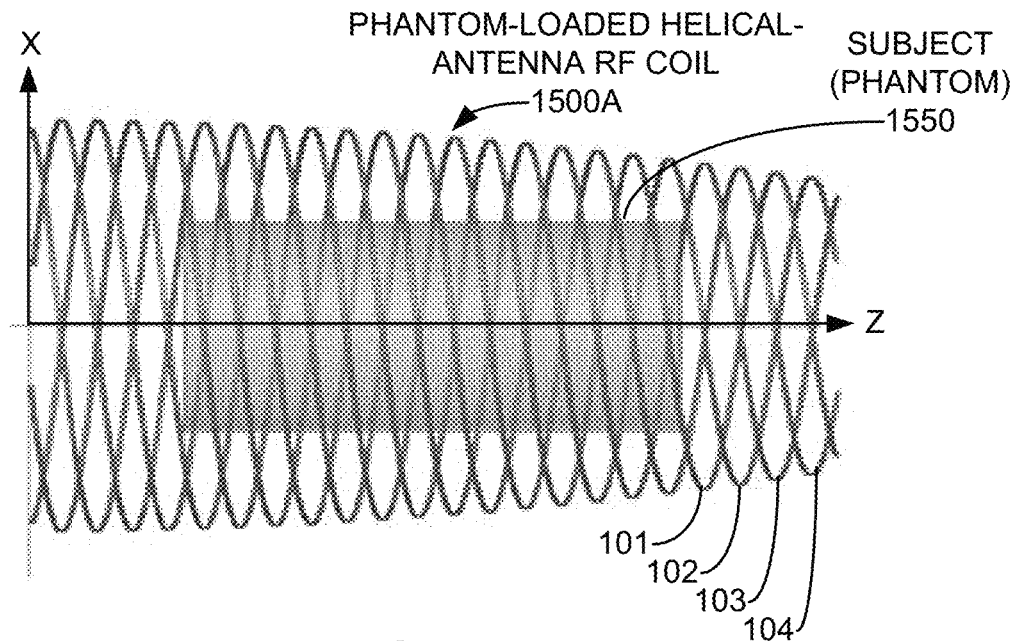
FIG. 15A is a side view of an example subject-loaded quadrifilar (four-channel) helical-antenna RF coil of varying diameter for use in MRI scanning.
Figure 15B:
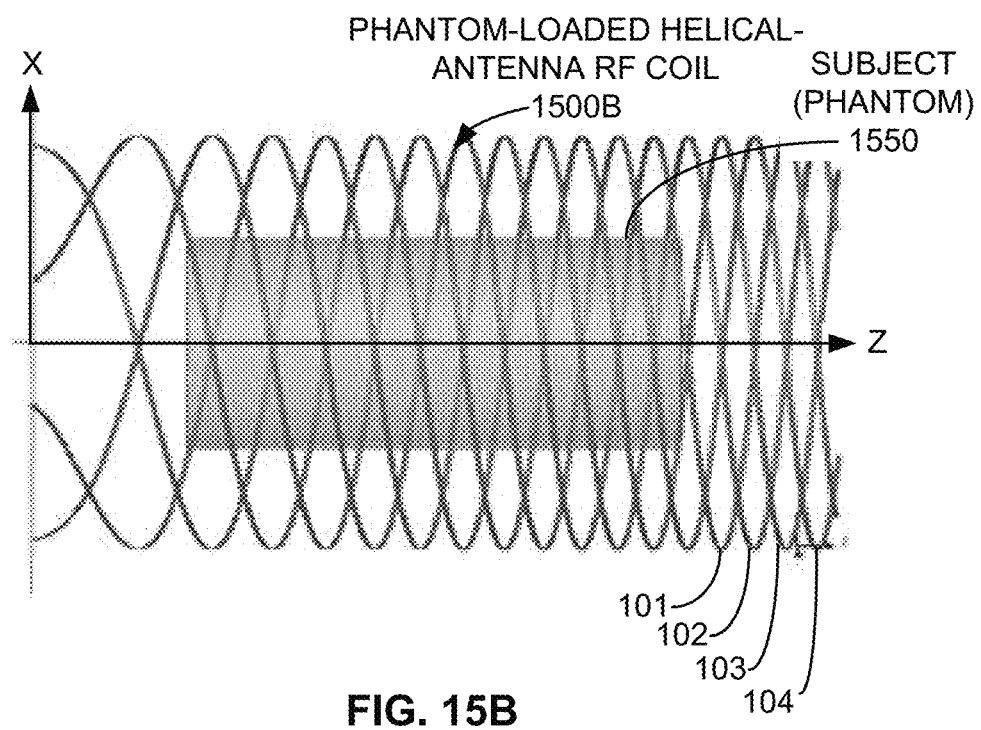
FIG. 15B is a side view of an example subject-loaded quadrifilar (four-channel) helical-antenna RF coil of varying pitch for use in MRI scanning.

For example, FIG. 15A is a side view of an example quadrifilar (four-channel) helical-antenna RF coil 1500A of varying diameter loaded with a phantom 1550 for use in MRI scanning. More specifically, the radius of each helix 101-104 of the antenna 1500A is reduced when progressing from the excitation port end (e.g., the left end of the antenna 1500A) of each helix 101-104 to the free end (e.g., the left end of the antenna 1500A). The radius may be increased in that same direction in other embodiments, however, or even be increased or decreased at various locations along the helices 101-104. In another example, FIG. 15B is a side view of an example subject-loaded quadrifilar helical-antenna RF coil 1500B of varying pitch for use in MRI scanning an subject, such as the phantom 1550. In this particular example, the pitch decreases when progressing from left to right, while, in other examples, the pitch may increase in that direction, or may utilize some combination thereof. Overall, by varying the pitch and/or radius along the length of the helical-antenna RF coil 1500, power efficiency and field homogeneity may be increased. In addition, deliberate mismatching of the helices 101-104 along their lengths by changing the width and/or shape of the helical strips, gradually changing the helix strip material (and thus the electrical impedance and other properties thereof), adding lumped impedance loads along the lengths of the helices 101-104, and/or terminating the helices 101-104 in a number of ways, may result in better field homogeneity, better polarization, and/or increased power being delivered to the phantom 1550. Other aspects related to the helical-antenna RF coil 1500, such as helix 101-104 length, the number of helices 101-104, the position of the helices 101-104 within the bore, and the position of the phantom 1550 with respect to the helices 101-104 and the bore, may also be varied to similar end.

Figure 16:
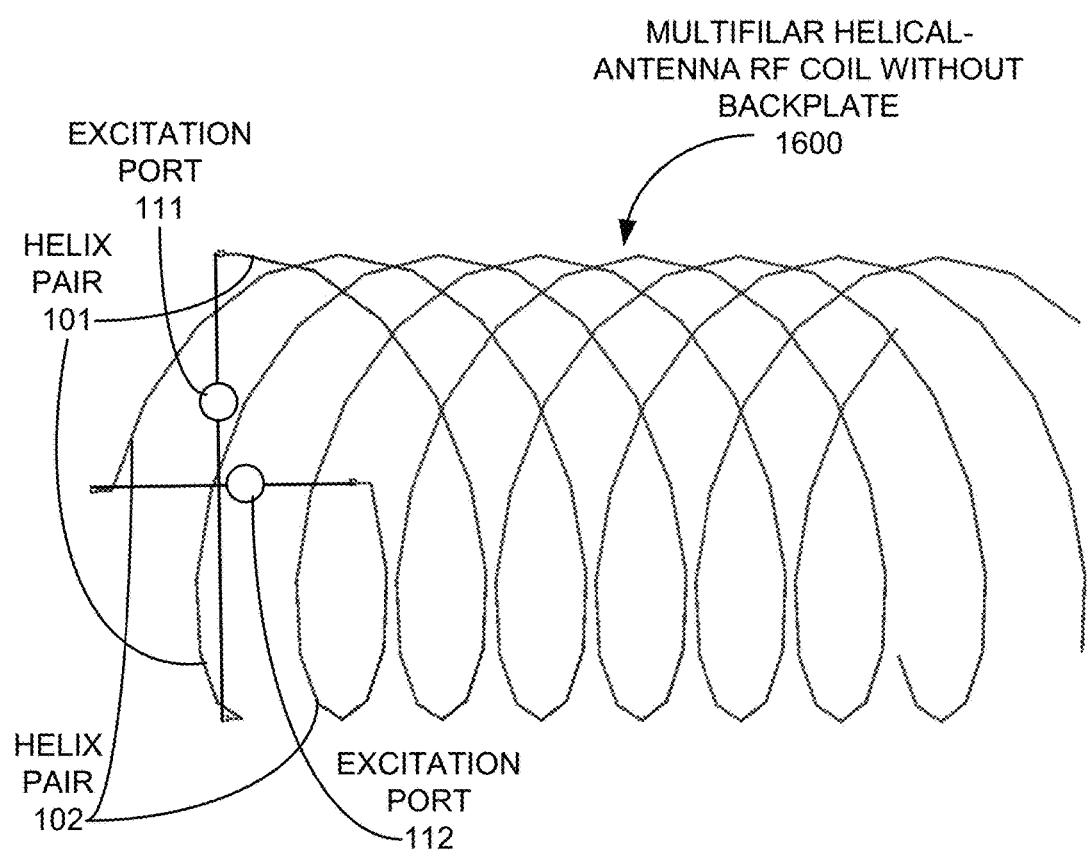
FIG. 16 is a perspective view of an example multifilar (multi-channel) helical-antenna RF coil without a back plate and with oppositely-oriented helices for use in MRI scanning.

FIG. 16 is a perspective view of an example multifilar (multi-channel) helical-antenna RF coil 1600 without back plate for use in MRI scanning. In this specific example, helix pairs 101 and 102 are driven by corresponding excitation ports 111 and 112, respectively. In this arrangement, each helix within each helix pair 101 and 102 is arranged 180 degrees apart along a circumference of the helical-antenna RF coil 1600, and with one helix pair (e.g., helix pair 101) arranged 90 degrees about the circumference of the helical-antenna RF coils 1600 from the other helix pair (e.g., helix pair 102). In some examples, the excitation ports 111 and 112 may be balanced with the aid of baluns.

Figure 17:
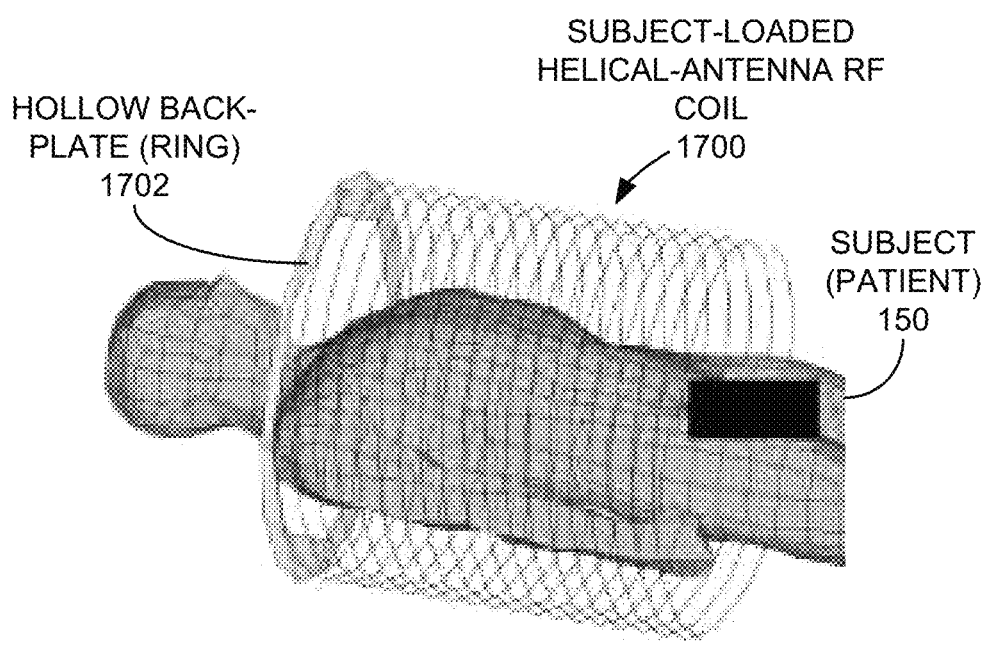
FIG. 17 is a perspective view of an example quadrifilar (four-channel) helical-antenna RF coil employing a hollow back plate for use in MRI scanning.

FIG. 17 is a perspective view of an example quadrifilar (four-channel) helical-antenna RF coil 1700 employing a hollow back plate 1702 similar to that shown in the example of FIG. 10 for use in MRI scanning. Such examples may facilitate greater access to areas of the subject 150 by allowing portions of the subject 150 (e.g., the head of the patient) to extend beyond both ends of the antenna 1700. In other embodiments, the back plate 1702 may be constructed at least partially of mesh instead of being open at the center of the plate. In each case, other number of helices may be employed in other embodiments. These examples may alleviate potential problems with solid back plates, in which large eddy electrical currents may be created, which in turn may translate into signal losses and spatial distortion when the subject 150 is located close to the back plate. Also, those eddy currents may also generate mechanical vibrations that produce acoustic noise. Moreover, a solid back plate may block optical signals that may be used for visual stimulation of the subject 150, a technique sometimes used in functional MRI studies.

Figure 18:
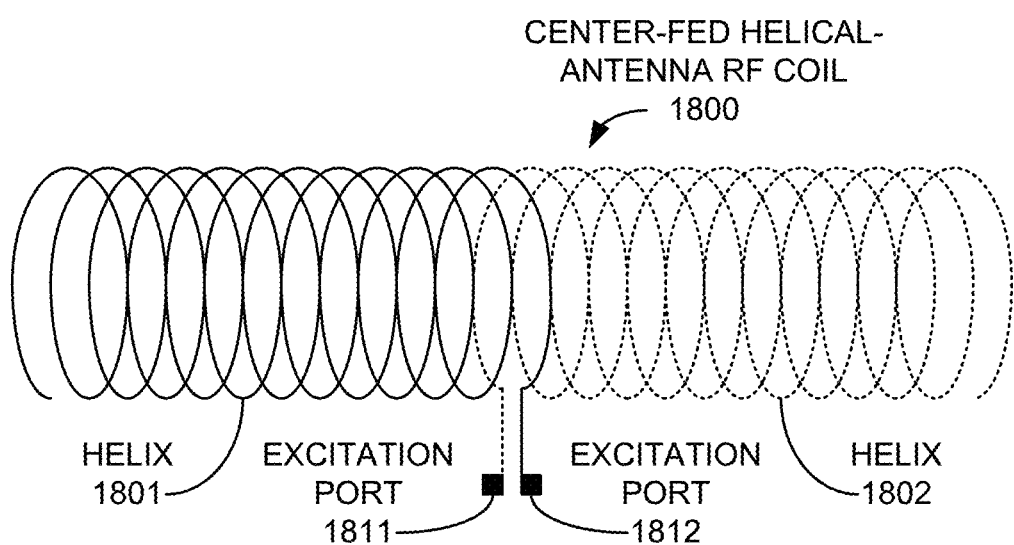
FIG. 18 is a side view of an example center-fed helical-antenna RF coil for use in MRI scanning.

In other embodiments, a conductive plate, whether solid or ring-like, may be eliminated with respect to helical RF excitation antennas by using of a center-fed helical-antenna RF coil. For example, FIG. 18 is a side view of an example center-fed monofilar helical-antenna RF coil 1800 having a first helix 1801 and a second helix 1802 oriented coaxially and end-to-end. In the particular example of FIG. 18, excitation ports 1811 and 1812 corresponding to the helices 1801 and 1802 are shown located toward the center of the overall antenna 1800A. Such an antenna 1800 may be fed with a balanced excitation signal, which may inform the use of a balun to drive both excitation ports 1811 and 1812 of the antenna 1800. In other examples, multiple coaxially-wound interleaved helices may be employed in place of each of the helices 1811 and 1812 depicted in FIG. 18. In such embodiments, the use of a back plate (e.g., back plate 130 in various embodiments discussed) may be eliminated, and thus facilitate greater access to the bore, as well as enhanced subject comfort. Also, such embodiments may allow longitudinal phasing, which introduces the possibility of spatial encoding along the longitudinal direction of the bore and the helical-antenna RF coil 1800. In addition, the use of multiple helices and channels may add more degrees of freedom to the design, thus facilitating optimization for greater magnetic field uniformity. In other examples, multiple helices may be employed independently for parallel imaging.

Figure 19:
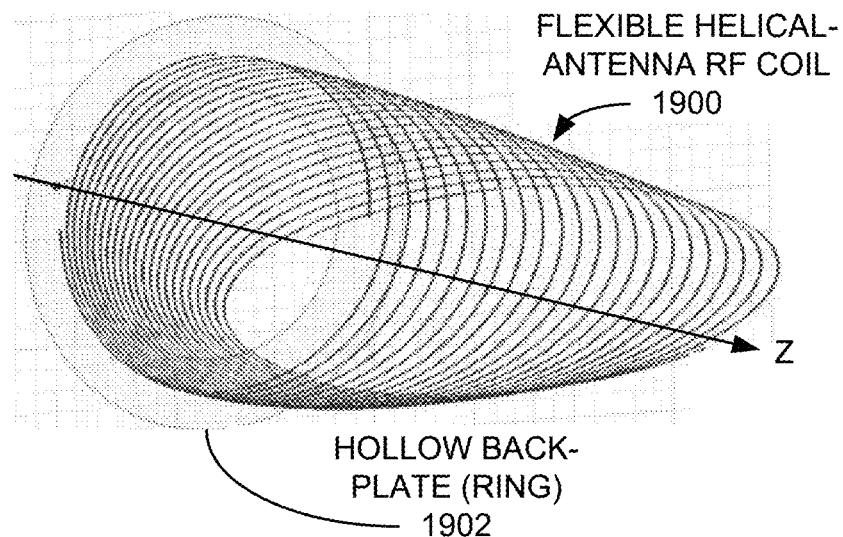
FIG. 19 is a perspective view of an example flexible quadrifilar (four-channel) helical-antenna RF coil for use in MRI scanning.

Any of the embodiments of FIGS. 17 and 18 may be further modified to create more subject-friendly MRI scanning systems. For example, FIG. 19 is a perspective view of a flexible quadrifilar (four-channel) helical-antenna RF coil 1900 for use in MRI scanning, although other numbers of helices (e.g., one, two, eight, and so forth) may be utilized in other examples. Using a hollow back plate 1902 (e.g., similar to the back plate 1702 of FIG. 17) or a helical-antenna RF coil that does not use a back plate (e.g., the helical-antenna RF coil 1800 of FIG. 18), the helical-antenna RF coil 1900 may be a printable coil that is flexible and, thus, conforms more closely to the shape of a subject, such as the torso of a human patient. As a result of the helical-antenna RF coil 1900 being located more closely to the subject, the energy of the magnetic field generated by the antenna 1900 may be more fully coupled to the subject, thus providing for more accurate tissue imaging.

Figure 20:
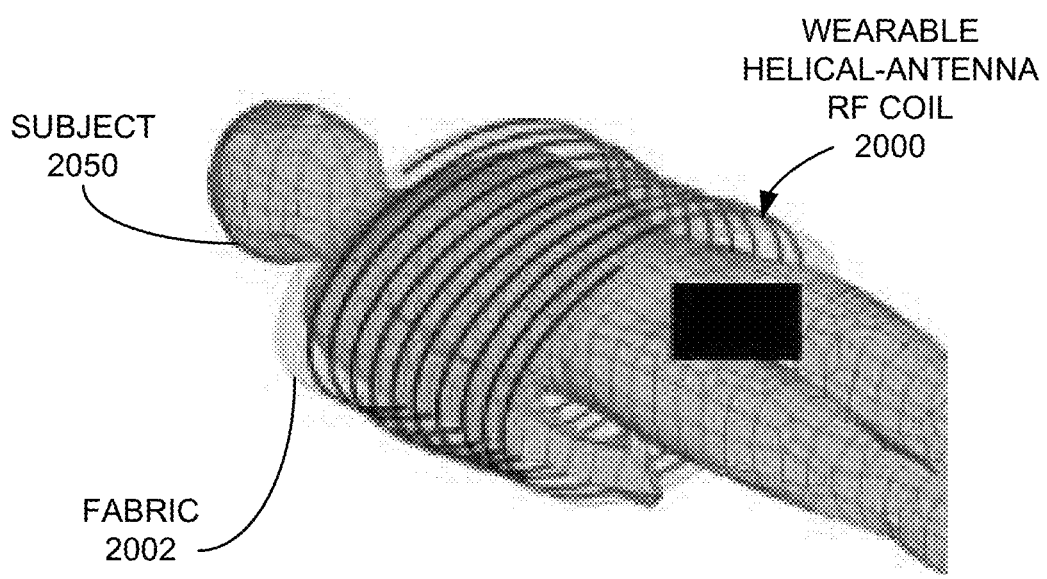
FIG. 20 is a perspective view of an example wearable quadrifilar (four-channel) helical-antenna RF coil for use in MRI scanning.

Similarly, FIG. 20 is a perspective view of an example wearable quadrifilar (four-channel) helical-antenna RF coil 2000 for use in MRI scanning. In some examples, the helical-antenna RF coil 2000 may be shown into a fabric 2002, such as a garment (e.g., shirt, sleeve, and so forth) that may be worn by a subject 2050, thereby increasing the comfort, flexibility, efficiency, and convenience of the scanning process for both the subject 2050 and the operator of the MRI scanning system.

While particular helical-antenna RF coils and associated MRI scanning systems are discussed above, related embodiments may be created using different helix diameters, helix lengths, helix pitches, helix orientations (e.g., RCP versus LCP), numbers of helices, bore lengths, bore diameters, and other characteristics associated therewith. Also, the helical-antenna RF coil embodiments described herein may be employed as excitation coils only, detection coils only, or as both excitation coils and detection coils. Moreover, the use of multiple helices in at least some of the antennas discussed above may be employed to perform parallel imaging by simultaneously detecting data from more than one area of tissue concurrently, thus potentially accelerating the data acquisition process. One or more of these modifications may be made while retaining or more of the advantages presented above (e.g., enhanced field uniformity, greater tissue penetration, lower specific absorption rate, and/or so on) while facilitating MRI scanning at higher primary magnetic field strengths.

Additionally, the devices and methods for RF excitation using a subject-loaded helical-antenna RF coil, as described herein, are not limited to any particular field strength or frequency. While the examples described herein employ field strengths of 3 T, 7 T, and 10.5 T, the use of helical-antenna RF coils in MRI/NMR systems at any other field strength (e.g., 1.5 T, 4 T, 9.4 T, 11 T, 15 T, 16.4 T, and 21.1 T) is also contemplated. Furthermore, helical-antenna RF coils may be used as body RF coils (including those for whole-body imaging), head RF coils, and RF coils for scanning arms, hands, wrists, legs, knees, ankles, etc., and may be applied as RF transmitters and/or receivers. Also, such devices and methods are applicable in research, pre-clinical, and clinical MRI/NMR systems using phantoms, animals, and/or humans as subjects.

Figure 21:
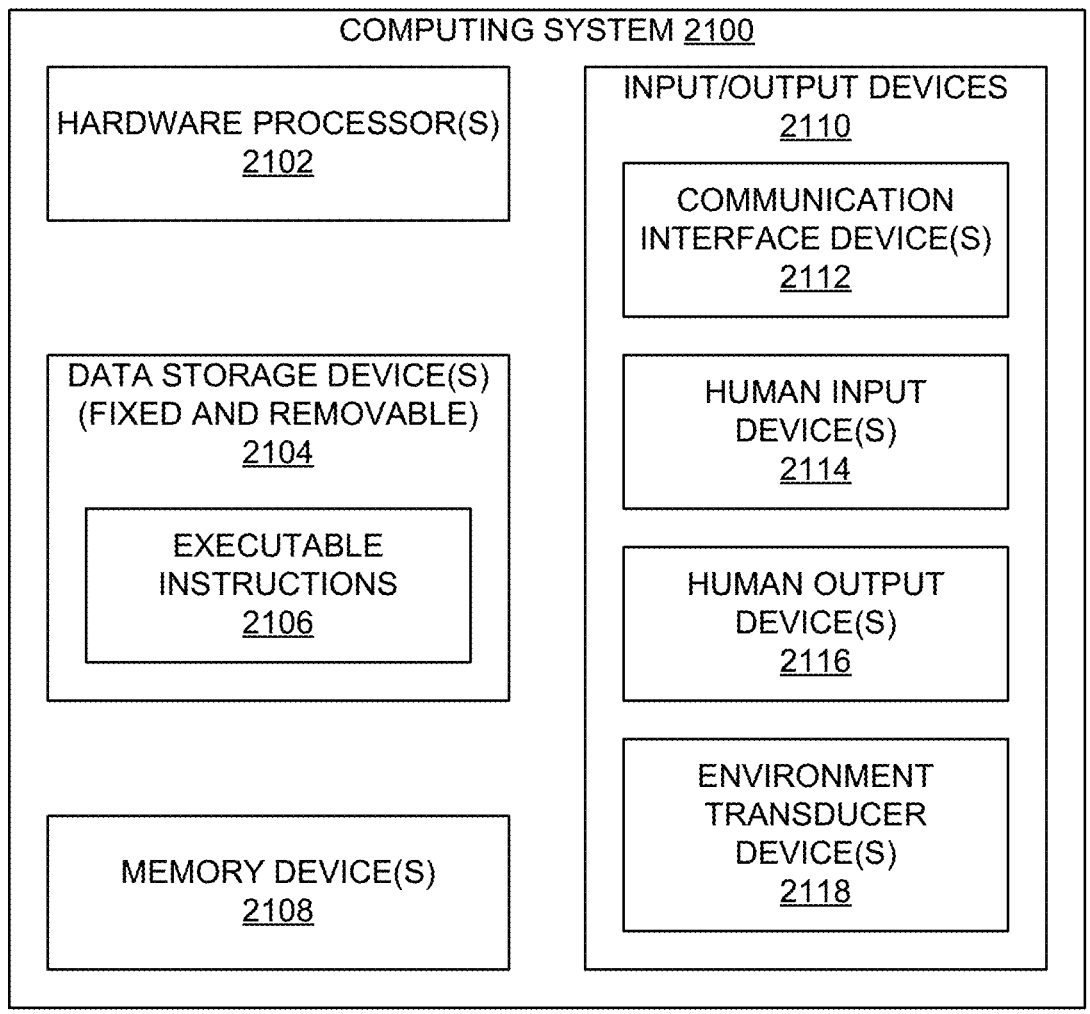
FIG. 21 is a block diagram of an example computing system for use in various MRI scanning systems disclosed herein.

FIG. 21 is a block diagram of a machine in the example form of a computer system 2100 within which instructions 2106 for causing the machine to perform any one or more of the methodologies discussed herein may be executed by one or more hardware processors 2102. In various embodiments, the machine operates as a standalone device or may be connected (e.g., networked) to other machines. In a networked deployment, the machine may operate in the capacity of a server or a client machine in server-client network environment, or as a peer machine in a peer-to-peer (or distributed) network environment. In some examples, the machine may be a desktop computer, a laptop computer, a tablet computer, a computing system embedded within another device or system, or any machine capable of executing instructions 2106 (sequential or otherwise) that specify actions to be taken by that machine. Further, while only a single machine is illustrated, the term "machine" shall also be taken to include any collection of machines that individually or jointly execute a set (or multiple sets) of instructions 2106 to perform any one or more of the methodologies discussed herein, such as the computing system 410 of FIG. 4.

As depicted in FIG. 21, the example computing system 2100 may include one or more hardware processors 2102, one or more data storage devices 2104, one or more memory devices 2108, and/or one or more input/output devices 2110. Each of these components may include one or more integrated circuits (ICs) (including, but not limited to, FPGAs, ASICs, and so on), as well as more discrete components, such as transistors, resistors, capacitors, inductors, transformers, and the like. Various ones of these components may communicate with one another by way of one or more communication buses, point-to-point communication paths, or other communication means not explicitly depicted in FIG. 21. Additionally, other devices or components, such as, for example, various peripheral controllers (e.g., an input/output controller, a memory controller, a data storage device controller, a graphics processing unit (GPU), and so on), a power supply, one or more ventilation fans, and an enclosure for encompassing the various components, may be included in the example computing system 2100, but are not explicitly depicted in FIG. 21 or discussed further herein.

The at least one hardware processor 2102 may include, for example, a central processing unit (CPU), a microprocessor, a microcontroller, and/or a digital signal processor (DSP). Further, one or more hardware processors 2102 may include one or more execution cores capable of executing instructions and performing operations in parallel with each other.

The one or more data storage devices 2104 may include any non-volatile data storage device capable of storing the executable instructions 2106 and/or other data generated or employed within the example computing system 2100. In some examples, the one or more data storage devices 2104 may also include an operating system (OS) that manages the various components of the example computing system 2100 and through which application programs or other software may be executed. Thus, in some embodiments, the executable instructions 2106 may include instructions of both application programs and the operating system. Examples of the data storage devices 2104 may include, but are not limited to, magnetic disk drives, optical disk drives, solid state drives (SSDs), flash drives, and so on, and may include either or both removable data storage media (e.g., Compact Disc Read-Only Memory (CD-ROM), Digital Versatile Disc Read-Only Memory (DVD-ROM), magneto-optical disks, flash drives, and so on) and non-removable data storage media (e.g., internal magnetic hard disks, SSDs, and so on).

The one or more memory devices 2108 may include, in some examples, both volatile memory (such as, for example, dynamic random access memory (DRAM), static random access memory (SRAM), and so on), and non-volatile memory (e.g., read-only memory (ROM), flash memory, and the like). In one embodiment, a ROM may be utilized to store a basic input/output system (BIOS) to facilitate communication between an operating system and the various components of the example computing system 2100. In some examples, DRAM and/or other rewritable memory devices may be employed to store portions of the executable instructions 2106, as well as data accessed via the executable instructions 2106, at least on a temporary basis. In some examples, one or more of the memory devices 2108 may be located within the same integrated circuits as the one or more hardware processors 2102 to facilitate more rapid access to the executable instructions 2106 and/or data stored therein.

The one or more data storage devices 2104 and/or the one or more memory devices 2108 may be referred to as one or more machine-readable media, which may include a single medium or multiple media (e.g., a centralized or distributed database, and/or associated caches and servers) that store the one or more executable instructions 2106 or data structures. The term "machine-readable medium" shall also be taken to include any tangible medium that is capable of storing, encoding, or carrying instructions 2106 for execution by the machine and that cause the machine to perform any one or more of the methodologies of the present invention, or that is capable of storing, encoding, or carrying data structures utilized by or associated with such instructions 2106.

The input/output devices 2110 may include one or more communication interface devices 2112, human input devices 2114, human output devices 2116, and environment transducer devices 2118. The one or more communication interface devices 2112 may be configured to transmit and/or receive information between the example computing system 2100 and other machines or devices by way of one or more wired or wireless communication networks or connections. The information may include data that is provided as input to, or generated as output from, the example computing device 2100, and/or may include at least a portion of the executable instructions 2106. Examples of such network or connections may include, but are not limited to, Universal Serial Bus (USB), Ethernet, Wi-Fi®, Bluetooth®, Near Field Communication (NFC), Long-Term Evolution (LTE), and so on. One or more such communication interface devices 2110 may be utilized to communicate one or more other machines, either directly over a point-to-point communication path, over a wide area network (WAN) (e.g., the Internet), over a local area network (WAN), over a cellular (e.g., third generation (3G) or fourth generation (4G)) network, or over another communication means. Further, one or more of one of wireless communication interface devices 2112, as well as one or more environment transducer devices 2118 described below, may employ an antenna for electromagnetic signal transmission and/or reception. In some examples, an antenna may be employed to receive Global Positioning System (GPS) data to facilitate determination of a location of the machine or another device.

In some embodiments, the one or more human input devices 2114 may convert a human-generated signal, such as, for example, human voice, physical movement, physical touch or pressure, and the like, into electrical signals as input data for the example computing system 2100. The human input devices 2114 may include, for example, a keyboard, a mouse, a joystick, a camera, a microphone, a touch-sensitive display screen ("touchscreen"), a positional sensor, an orientation sensor, a gravitational sensor, an inertial sensor, an accelerometer, and/or the like.

The human output devices 2116 may convert electrical signals into signals that may be sensed as output by a human, such as sound, light, and/or touch. The human output devices 2116 may include, for example, a display monitor or touchscreen, a speaker, a tactile and/or haptic output device, and/or so on.

The one or more environment transducer devices 2118 may include a device that converts one form of energy or signal into another, such as from an electrical signal generated within the example computing system 2100 to another type of signal, and/or vice-versa. Further, the transducers 2118 may be incorporated within the computing system 2100, as illustrated in FIG. 21, or may be coupled thereto in a wired or wireless manner. In some embodiments, one or more environment transducer devices 2118 may sense characteristics or aspects of an environment local to or remote from the example computing device 2100, such as, for example, light, sound, temperature, pressure, magnetic field, electric field, chemical properties, physical movement, orientation, acceleration, gravity, and so on. Further, in some embodiments, one or more environment transducer devices 2118 may generate signals to impose some effect on the environment either local to or remote from the example computing device 2100, such as, for example, physical movement of some object (e.g., a mechanical actuator), heating or cooling of a substance, adding a chemical substance to a substance, and so on.

Those skilled in the art will understand and appreciate that various modifications not explicitly described above may be made to the present disclosure and still remain within the scope of the present invention.

Although the present invention has been described with reference to preferred embodiments, persons skilled in the art will recognize that changes may be made in form and detail without departing from the scope of the invention.

What is claimed is:

1. A magnetic resonance imaging (MRI) scanning system comprising:
a structure defining a bore within which a subject is to be positioned for scanning, the bore defining a longitudinal axis;
a magnet to generate a primary magnetic field within the bore parallel to the longitudinal axis;
a helical-antenna radio-frequency (RF) coil oriented along the longitudinal axis to at least partially surround the subject when the subject is positioned within the bore for scanning;
a conductive plate coupled to a first end of the helical-antenna RF coil;
an RF signal generator to drive the helical-antenna RF coil at the first end to generate a circularly polarized (CP) RF magnetic field perpendicular to the longitudinal axis;
an RF detector to detect a response signal generated by tissues of the subject in response to the CP RF magnetic field; and
a computing system to create an image of the tissues of the subject based on the detected response signal.

2. The MRI scanning system of claim 1, wherein the RF detector detects the response signal via the helical-antenna RF coil.

3. The MRI scanning system of claim 1, the traveling-wave magnetic field comprising a right-hand CP magnetic field.

4. The MRI scanning system of claim 1, wherein the conductive plate spans at least a width of the helical-antenna RF coil.

5. The MRI scanning system of claim 4, further comprising an excitation port coupling the conductive plate with the first end of the helical-antenna RF coil, the RF signal generator to drive the helical-antenna RF coil via the excitation port.

6. The MRI scanning system of claim 1, wherein the conductive plate is a conductive ring coupled to a first end of the helical-antenna RF coil, the conductive ring comprising an inner diameter less than a diameter of the helical-antenna RF coil and an outer diameter greater than the diameter of the helical-antenna RF coil.

7. The MRI scanning system of claim 1, the helical-antenna RF coil comprising a monofilar helical-antenna RF coil, the RF signal generator to drive the helical-antenna RF coil with a time-varying voltage.

8. The MRI scanning system of claim 1, the helical-antenna RF coil comprising a bifilar helical-antenna RF coil, the bifilar helical-antenna RF coil comprising a first helix and a second helix, the first and second helices being interleaved, the RF signal generator to drive the first helix and the second helix with corresponding time-varying voltages in counter-phase.

9. The MRI scanning system of claim 1, the helical-antenna RF coil comprising a quadrifilar helical-antenna RF coil, the quadrifilar helical-antenna RF coil comprising a first helix, a second helix, a third helix, and a fourth helix, the first, second, third, and fourth helices being interleaved, the RF signal generator to drive the first, second, third, and fourth helices with corresponding time-varying voltages in quadrature.

10. The MRI scanning system of claim 1, the helical-antenna RF coil comprising an octafilar helical-antenna RF coil, the octafilar helical-antenna RF coil comprising a first helix, a second helix, a third helix, a fourth helix, a fifth helix, a sixth helix, a seventh helix, and an eighth helix, the first, second, third, fourth, fifth, sixth, seventh, and eighth helices being interleaved, the RF signal generator to drive the first, second, third, fourth, fifth, sixth, seventh, and eighth helices with corresponding time-varying voltages in octature.

11. The MRI scanning system of claim 1, the helical-antenna RF coil comprising a varying diameter along the longitudinal axis, the RF signal generator to drive the helical-antenna RF coil at an end of the helical-antenna RF coil.

12. The MRI scanning system of claim 1, the helical-antenna RF coil comprising a varying pitch along the longitudinal axis, the RF signal generator to drive the helical-antenna RF coil at an end of the helical-antenna RF coil.

13. The MRI scanning system of claim 1, the helical-antenna RF coil comprising a quadrifilar helical-antenna RF coil, the quadrifilar helical-antenna RF coil comprising a first helix, a second helix, a third helix, and a fourth helix, the first, second, third, and fourth helices being interleaved, the RF signal generator to drive an end of the first helix and an end of the third helix using a first time-varying voltage, and the RF signal generator to drive an end of the second helix and an end of the fourth helix using a second time-varying voltage in quadrature to the first time-varying voltage.

14. The MRI scanning system of claim 1, the helical-antenna RF coil defining a non-circular cross-section at least at one point along a length of the helical-antenna RF coil.

15. The MRI scanning system of claim 1, the helical-antenna RF coil comprising:
a first helix extending from a central area of the helical-antenna RF coil toward a first end of the helical-antenna RF coil; and
a second helix extending from the central area of the helical-antenna RF coil toward a second end of the helical-antenna RF coil, the RF signal generator to drive the first helix and the second helix at the central area of the helical-antenna RF coil.

16. The MRI scanning system of claim 1, the helical-antenna RF coil being flexible for wrapping around the subject.

17. The MRI scanning system of claim 1, the helical-antenna RF coil being printable for use within a fabric to be worn by the subject.

18. The MRI scanning system of claim 1, the helical-antenna RF coil comprising N coaxially-wound interleaved helices, the RF signal generator to drive each of the N helices with a corresponding voltage of (360/N)-degree phase increment in azimuthal order against a common conductive back plate.

19. A method of MRI scanning, the method comprising:
driving a magnet coil to create a primary magnetic field within a bore of an MRI scanning system along a longitudinal axis of the bore;
driving a helical-antenna radio-frequency (RF) coil oriented along the bore with an RF signal to generate a circularly polarized (CP) RF magnetic field perpendicular to the longitudinal axis;
detecting a response signal generated by tissues of a subject at least partially positioned in a volume defined by the helical-antenna RF coil in response to the CP RF magnetic field; and
creating an image of the tissues of the subject based on the detected response signal.

20. The method of claim 19, the helical-antenna RF coil comprising a monofilar helical-antenna RF coil, the RF signal comprising a time-varying voltage.

21. The method of claim 19, the helical-antenna RF coil comprising a bifilar helical-antenna RF coil, the bifilar helical-antenna RF coil comprising a first helix and a second helix, the first and second helices being interleaved, the driving of the helical-antenna RF coil comprising driving the first helix and the second helix with corresponding time-varying voltages in counter-phase.

22. The method of claim 19, the helical-antenna RF coil comprising a quadrifilar helical-antenna RF coil, the quadrifilar helical-antenna RF coil comprising a first helix, a second helix, a third helix, and a fourth helix, the first, second, third, and fourth helices being interleaved, the driving of the helical-antenna RF coil comprising driving the first, second, third, and fourth helices with corresponding time-varying voltages in quadrature.

23. The method of claim 19, the helical-antenna RF coil comprising an octafilar helical-antenna RF coil, the octafilar helical-antenna RF coil comprising a first helix, a second helix, a third helix, a fourth helix, a fifth helix, a sixth helix, a seventh helix, and an eighth helix, the first, second, third, fourth, fifth, sixth, seventh, and eighth helices being interleaved, the driving of the helical-antenna RF coil comprising driving the first, second, third, fourth, fifth, sixth, seventh, and eighth helices with corresponding time-varying voltages in octature.

24. A magnetic resonance imaging (MRI) scanning system comprising:
a structure defining a bore within which a subject is to be positioned for scanning, the bore defining a longitudinal axis;
a magnet to generate a primary magnetic field within the bore parallel to the longitudinal axis;
a helical-antenna radio-frequency (RF) coil oriented along the longitudinal axis to surround the subject when the subject is positioned within the bore for scanning, the helical-antenna RF coil comprising a plurality of interleaved helices;
a conductive plate coupled to a first end of the helical-antenna RF coil;
an RF signal generator to drive each of the plurality of helices at the first end to generate a circularly-polarized (CP) RF magnetic field perpendicular to the longitudinal axis within the bore;
an RF detector to detect a response signal generated by tissues of the subject in response to the CP RF magnetic field; and
a computing system to create an image of the tissues of the subject based on the detected response signal.

* * * * *